US012635579B2

(12) United States Patent
Liu et al.

(10) Patent No.: US 12,635,579 B2
(45) Date of Patent: May 19, 2026

(54) CHIP PACKAGE STRUCTURES, MANUFACTURING METHODS THEREOF AND ELECTRONIC DEVICES

(71) Applicant: Yangtze Memory Technologies Co., Ltd., Hubei (CN)

(72) Inventors: Peng Liu, Hubei (CN); Baohua Zhang, Hubei (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 435 days.

(21) Appl. No.: 18/092,081

(22) Filed: Dec. 30, 2022

(65) Prior Publication Data

US 2024/0178190 A1     May 30, 2024

Related U.S. Application Data

(63) Continuation of application No. PCT/CN2022/134479, filed on Nov. 25, 2022.

(51) Int. Cl.
H01L 25/065     (2023.01)
H10W 20/00     (2026.01)
(Continued)

(52) U.S. Cl.
CPC ......... H10W 90/00 (2026.01); H10W 20/023 (2026.01); H10W 72/20 (2026.01);
(Continued)

(58) Field of Classification Search
CPC . H01L 25/0657; H01L 21/563; H01L 21/565; H01L 21/76898
See application file for complete search history.

(56) References Cited

U.S. PATENT DOCUMENTS 6,369,448 B1 *   4/2002   McCormick ........ H01L 25/0652
                                         257/737
7,479,407 B2 *   1/2009   Gehman ............. H01L 25/0657
                                         257/659
(Continued)

FOREIGN PATENT DOCUMENTS

CN          101232004 A  *  7/2008   ......... H01L 25/0657
CN          102543939 A  *  7/2012
(Continued)

OTHER PUBLICATIONS

Japanese Patent Office, "Notice of Refusal," issued in connection with Japanese Patent Application No. 2023-539179, mailed on Mar. 18, 2025, 10 pages. [English language machine translation included.].

(Continued)

*Primary Examiner* — Laura M Menz
(74) *Attorney, Agent, or Firm* — Hanley, Flight & Zimmerman, LLC

(57)          ABSTRACT
In one example, the disclosed semiconductor structure includes a package substrate, a first chip, a conductive pillar and a second chip, wherein the package substrate has a first surface; the first chip is located on the first surface of the package substrate and electrically connected to the package substrate; the conductive pillar is located on the first surface of the package substrate and electrically connected to the package substrate; the second chip is located on a side of the first chip and the conductive pillar away from the package substrate and electrically connected to the conductive pillar; and an orthographic projection of the conductive pillar on the package substrate is located within a range of an orthographic projection of the first chip or the second chip on the package substrate. The chip package structure is configured
(Continued)

for connection with a circuit board in the electronic device. Other examples are disclosed.

15 Claims, 9 Drawing Sheets

(51) Int. Cl.

| | | |
|---|---|---|
| *H10W 72/20* | (2026.01) | |
| *H10W 74/01* | (2026.01) | |
| *H10W 74/15* | (2026.01) | |
| *H10W 90/00* | (2026.01) | |
| *H10W 72/00* | (2026.01) | |

(52) U.S. Cl.
CPC ....... *H10W 74/012* (2026.01); *H10W 74/016* (2026.01); *H10W 74/15* (2026.01); *H10W 72/856* (2026.01); *H10W 90/734* (2026.01)

(56)     References Cited

U.S. PATENT DOCUMENTS

| | | | | |
|---|---|---|---|---|
| 9,735,132 | B1 | 8/2017 | Yang et al. | |
| 9,825,010 | B2 * | 11/2017 | Fang | H01L 24/09 |
| 11,296,051 | B2 | 4/2022 | Kao et al. | |
| 2008/0164605 | A1 * | 7/2008 | Wu | H01L 23/3128 257/E23.079 |
| 2012/0074587 | A1 * | 3/2012 | Koo | H01L 21/565 438/109 |
| 2012/0139090 | A1 * | 6/2012 | Kim | H01L 25/105 257/659 |
| 2015/0206848 | A1 * | 7/2015 | Boja | H01L 21/563 438/126 |
| 2015/0364448 | A1 * | 12/2015 | Huang | H01L 24/10 257/659 |
| 2016/0240480 | A1 | 8/2016 | Lin et al. | |
| 2016/0284642 | A1 * | 9/2016 | Ganesan | H01L 23/49827 |
| 2017/0287874 | A1 * | 10/2017 | Fang | H01L 24/11 |
| 2019/0279925 | A1 * | 9/2019 | Hsu | H01L 24/81 |
| 2020/0135606 | A1 * | 4/2020 | Pan | H01L 23/49827 |
| 2020/0411499 | A1 * | 12/2020 | Hsu | H01L 23/5383 |
| 2022/0223512 | A1 | 7/2022 | Kuo et al. | |
| 2023/0420339 | A1 * | 12/2023 | Lai | H01L 23/3672 |
| 2024/0178190 | A1 * | 5/2024 | Liu | H01L 25/50 |
| 2025/0125206 | A1 * | 4/2025 | Chang Chien | H01L 25/162 |

FOREIGN PATENT DOCUMENTS

| | | | | | |
|---|---|---|---|---|---|
| CN | 102593110 | A | * | 7/2012 | |
| CN | 104253058 | A | | 12/2014 | |
| CN | 102593110 | B | * | 7/2015 | |
| CN | 102543939 | B | * | 9/2015 | |
| CN | 105765711 | A | | 7/2016 | |
| CN | 107946282 | A | * | 4/2018 | H01L 21/76885 |
| CN | 107946282 | B | * | 9/2020 | H01L 23/525 |
| CN | 111613589 | A | * | 9/2020 | H01L 21/4846 |
| CN | 111933591 | A | | 11/2020 | |
| CN | 113725170 | A | | 11/2021 | |
| CN | 115132709 | A | | 9/2022 | |
| CN | 118402062 | A | * | 7/2024 | H01L 23/5383 |
| DE | 102019118361 | A1 | * | 4/2020 | H01L 21/563 |
| EP | 4401078 | A1 | * | 7/2024 | H01L 23/5383 |
| EP | 4401078 | B1 | * | 1/2025 | H01L 23/5383 |
| JP | 2018174241 | A | | 11/2018 | |
| JP | 2024546538 | A | * | 12/2024 | H01L 23/5383 |
| KR | 20130091624 | A | | 8/2013 | |
| KR | 20130115073 | A | | 10/2013 | |
| KR | 101711045 | B1 | * | 3/2017 | H01L 23/3128 |
| KR | 20180102972 | A | | 9/2018 | |
| KR | 101938949 | B1 | | 1/2019 | |
| KR | 101942733 | B1 | * | 1/2019 | H01L 24/33 |
| KR | 20240092625 | A | * | 6/2024 | H01L 23/5383 |
| TW | 200830520 | A | | 7/2008 | |
| TW | 201903992 | A | | 1/2019 | |
| TW | 201939678 | A | | 10/2019 | |
| TW | I719202 | B | | 2/2021 | |
| TW | I766869 | B | | 6/2022 | |
| WO | WO-2004049394 | A2 | * | 6/2004 | H01L 23/552 |
| WO | WO-2015099684 | A1 | * | 7/2015 | H01L 24/96 |
| WO | WO-2024108590 | A1 | * | 5/2024 | H01L 23/5383 |

OTHER PUBLICATIONS

International Searching Authority, "International Search Report," issued in connection with International Patent Application No. PCT/CN2022/134479, mailed on Apr. 7, 2023, 6 pages. [English Machine Translation].

Taiwan Intellectual Property Office, "Notice of Review Opinion and Search Report," issued in connection with Taiwan Patent Application No. 112123544, dated Jun. 27, 2024, 30 pages. [English Machine Translation Included].

European Patent Office, "Communication under Rule 71(3) EPC," issued in connection with European Patent Application No. 22 871 070.3-1211, mailed on Sep. 17, 2024, 63 pages.

Korean Intellectual Property Office, "Written Opinion," issued in connection with Korean Patent Application No. 10-2023-7020641, mailed on Sep. 19, 2024, 13 pages. [English language machine translation included.].

Taiwan Intellectual Property Office, "Notice of Examination Opinion," issued in connection with Taiwan Patent Application No. 112123544, mailed on Jan. 8, 2025, 44 pages. [English language machine translation included.].

Korean Intellectual Property Office, "Written Decision on Registration," issued in connection with Korean Patent Application No. 10-2023-7020641, mailed on Feb. 4, 2025, 5 pages. [English language machine translation included.].

European Patent Office, "Extended European Search Report," issued in connection with European Patent Application No. 22871070.3, dated Jun. 17, 2024, 8 pages.

Korean Intellectual Property Office, "Request for the Submission of an Opinion," issued in connection with Korean Patent Application No. 2023-7020641, dated Jul. 18, 2024, 15 pages. [English Translation Included].

Japanese Patent Office, "Decision of Refusal," issued in connection with Japanese Patent Application No. 2023-539179, mailed on Aug. 19, 2025, 6 pages. [English language machine translation included.].

\* cited by examiner

100'

100

100

B-B'

D-D'

B-B'

Providing a packaging substrate — S1

Forming a conductive pillar on a first surface of the packaging substrate — S2

Disposing a first chip on the first surface of the packaging substrate — S3

Disposing a second chip on a side of the conductive pillar and the first chip away from the packaging substrate — S4

CHIP PACKAGE STRUCTURES, MANUFACTURING METHODS THEREOF AND ELECTRONIC DEVICES

RELATED APPLICATIONS

This application is a continuation of and claims the benefit of International Application No. PCT/CN2022/134479, filed on Nov. 25, 2022, which is hereby incorporated by reference in its entirety.

TECHNICAL FIELD

The present disclosure relates to the field of semiconductor technologies, and particularly relates to a chip package structures, manufacturing methods thereof, and electronic devices.

BACKGROUND

With the rapid development of wireless communication, automotive electronics and other consumer electronics, electronic devices have a trend of development towards multi-functionality. Therefore, in manufacturing these electronic devices, chips with different functions are usually packaged separately and then integrated, and the integrated components are disposed inside the electronic devices.

Package is an important step in the manufacturing process of the electronic devices. However, the chips in the prior art are prone to the problems of large size and relatively low rate of signal transmission after being packaged.

BRIEF DESCRIPTION OF THE DRAWINGS

For clearer descriptions of the technical solutions in the present disclosure, a brief introduction may be given hereinafter to the accompany drawings that may be used in some examples of the present disclosure. Apparently, the drawings in the following descriptions are merely for illustrating some examples of the present disclosure, and other drawings may be obtained by those of ordinary skill in the art according to these drawings. In addition, the drawings in the following descriptions may be considered as schematic diagrams but not a limitation to the product actual size, the method actual flow, etc. related to the examples of the present disclosure.

DETAILED DESCRIPTION

Figure 1:
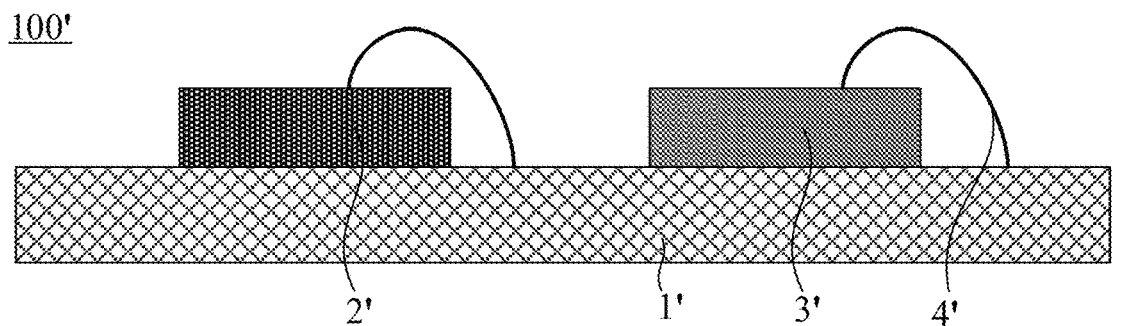
FIG. 1 is a schematic structure diagram of a chip package structure according to some examples.

The technical solutions in some examples of the present disclosure will be described clearly and completely below with reference to the accompanying drawings. Apparently, the described examples are only a part of examples of the present disclosure, rather than all of the examples. All other examples obtained by those of ordinary skill in the art based on the examples provided by the present disclosure shall fall within the scope of protection of the present disclosure.

In the descriptions of the present disclosure, it should be understood that directional or positional relationships indicated by the terms such as "center", "upper", "lower", "front", "back", "left", "right", "vertical", "horizontal", "top", "bottom", "inner", and "outer" are directional or positional relationships as shown in the drawings, only for the purposes of the ease in describing the present disclosure and simplification of its descriptions, but not indicating or implying that the specified apparatus or element has to be located in a specific direction, and structured and operated in a specific direction, and therefore, should not be understood as limitations to the present disclosure.

Unless the context otherwise requires, throughout the description and claims, the term "comprise" is interpreted as an open-ended inclusion, i.e., "comprising, but not limited to". In the descriptions, the terms "an example", "some examples", "examples", etc. are intended to indicate that a specific feature, structure, material or characteristic related to the example or example is included in at least one example or example of the present disclosure. Schematic representations of the above terms do not necessarily refer to the same example or example. In addition, the specific feature, structure, material or characteristic described may be included in any one or more examples or examples in any appropriate manner.

Hereinafter, the terms "first" and "second" are only intended for description and shall not be construed to indicate or imply relative importance, or imply the number of the indicated technical features. Therefore, the features defined by "first" and "second" can indicate or imply that one or more features are included. In the descriptions of the examples of the present disclosure, unless otherwise stated, "a plurality of" means two or more.

In describing some examples, the expressions of "connect" and its extensions may be used. For example, some examples may be described by using the term "connect" to indicate that two or more components are in direct physical or electrical contact. For another example, some examples may be described by using the term "couple" to indicate that two or more components are in direct physical contact or electrical contact. However, the term "couple" may also mean that two or more components are not in direct contact but still cooperate or interact with each other. The examples disclosed herein are not necessarily limited to the content herein.

"At least one of A, B and C" and "at least one of A, B or C" have the same meaning of including the following combinations of A, B and C: only A, only B, only C, a combination of A and B, a combination of A and C, a combination of B and C, and a combination of A, B and C.

"A and/or B" includes the following three combinations: only A, only B, and a combination of A and B.

In addition, the use of "based on" means openness and inclusiveness, because the process, step, calculation or other actions "based on" one or more conditions or values can be based on additional conditions or beyond the values in practice.

In the present disclosure, the meaning of "on," "above," and "over" should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The disclosure describes examples with reference to sectional views and/or planar views as idealized illustrative drawings. In the drawings, the thicknesses of layers and areas are enlarged for clarity. It is thus conceivable of the change in shape with respect to the drawings due to, for example, manufacturing techniques and/or tolerances. Therefore, the examples should not be interpreted to be limited to the shape of the area shown herein, but to include the shape deviation due to, for example, manufacturing. For example, an etched area shown as a rectangle will generally have a curved feature. Therefore, the areas shown in the drawings are schematic in nature, and their shapes are neither intended to show the actual shape of the area of the device, nor intended to limit the scope of the examples.

In an implementation, as shown in FIG. 1, a first chip 2' and a second chip 3' in a chip package structure 100' are typically disposed side by side on a package substrate 1' in a tiling manner.

A plurality of gold fingers are disposed on a side of the package substrate 1' close to the first chip 2' and the second chip 3'. The first chip 2' and the second chip 3' are respectively connected to the gold fingers by gold wires 4' by using the WB (wire bonding) process, so that the first chip 2' and the second chip 3' may be electrically connected by the respectively connected gold wires 4' and the package substrate 1', thereby realizing communication between the first chip 2' and the second chip 3'.

However, the first chip 2' and the second chip 3' are disposed side by side, which makes the area of the chip package structure 100' larger. Moreover, due to the wire arcs of the gold wires 4' and the existence of the gold fingers, it is necessary to reserve certain areas around the first chip 2' and the second chip 3', which further increases the area of the chip package structure 100'. Generally, the area of the chip package structure 100' obtained after the first chip 2' and the second chip 3' are packaged is increased by at least 30% compared with the sum of the areas of the first chip 2' and the second chip 3'. In addition, due to large lengths and high resistance of the gold wires 4', the rate of signal transmission may be low in the process of transmitting a signal between the first chip 2' and the second chip 3' through the different gold wires 4'.

Figure 2:
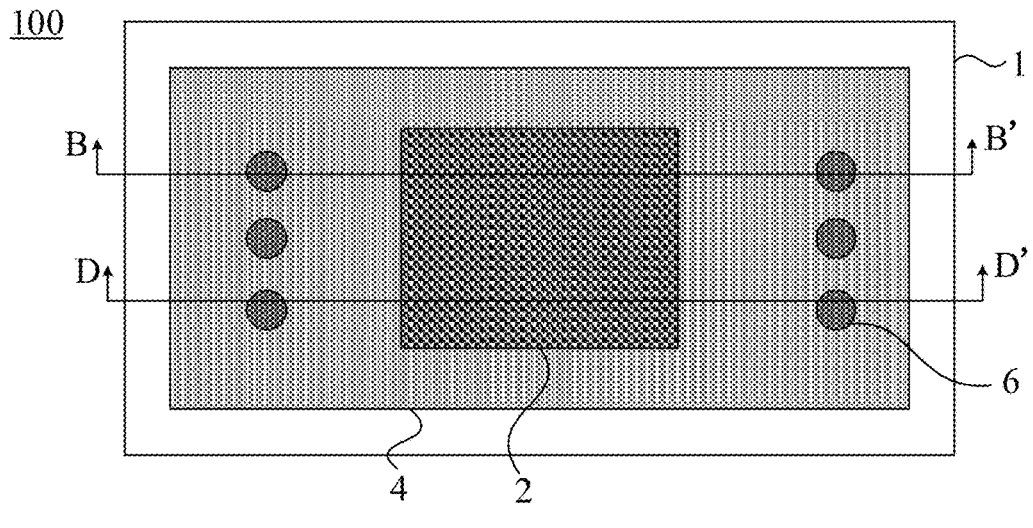
FIG. 2 is a top view of a chip package structure according to some examples.
Figure 3:
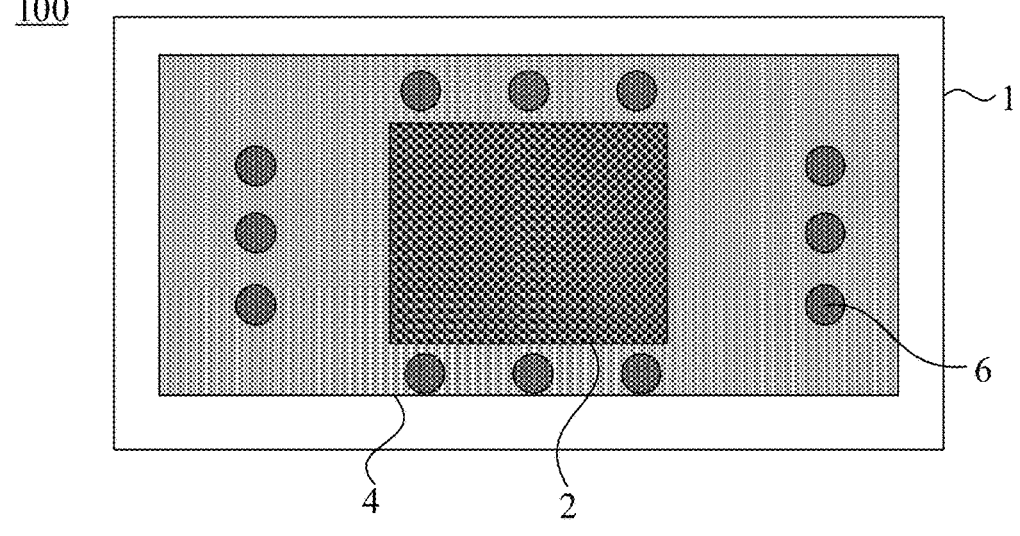
FIG. 3 is a top view of another chip package structure according to some examples.
Figure 4:
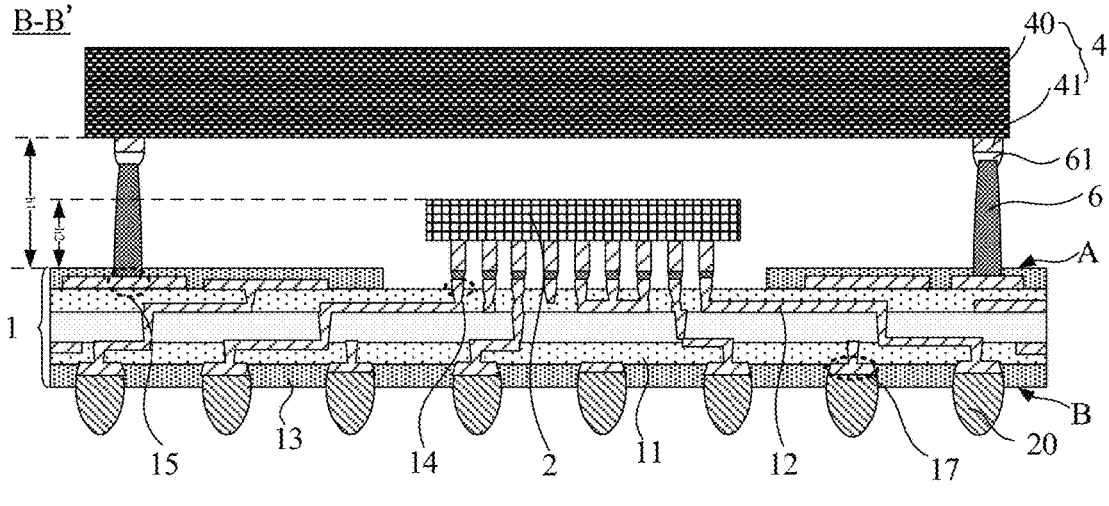
FIG. 4 is a sectional structure diagram of the chip package structure shown in FIG. 2 in a B-B' direction.

Accordingly, in some examples of the present disclosure, a chip package structure 100 is provided. There may be various types of chip package structures 100, such as an embedded multi-media card (EMMC), a universal flash storage (UFS) and a multi-chip package (MCP). As shown in FIGS. 2, 3, and 4, the chip package structure 100 includes a first chip 2, a conductive pillar 6, and a second chip 4.

The first chip 2 and the second chip 4 may have different functions. For example, the first chip 2 may be a controller, and the second chip 4 may be a memory chip. The memory chip has a memory structure for providing a storage function. There may be various types of memory chips. For example, the memory chip includes but are not limited to a Nand chip, a resistive memory chip, and a dynamic random-access memory. Of course, the first chip 2 may also be a memory chip, and the second chip 4 may also be a controller, which is not limited in the examples of the present disclosure.

In some examples, the chip package structure 100 further includes a package substrate 1. The package substrate 1 is rigid and thus may provide support for the first chip 2, the conductive pillar 6, and the second chip 4. A reference may be made to the following descriptions for the conductive pillar 6, which is not explained herein.

In some examples, as shown in FIG. 4, the package substrate 1 includes a plurality of dielectric layers 11 and a plurality of metal wiring layers 12, which are alternately disposed. One metal wiring layer 12 is disposed between two adjacent dielectric layers 11, and one dielectric layer 11 is disposed between two adjacent metal wiring layers 12. Each metal wiring layer 12 includes a metal line, and the metal lines in two adjacent metal wiring layers 12 may run through the dielectric layer 11 between the two metal wiring layers 12 and be connected as required.

In some examples, the dielectric layer 11 in the package substrate 1 is formed by a spin coating process, and the metal wiring layer 12 in the package substrate 1 is formed by a physical vapor deposition (PVD) process in combination with an electroplating process. Therefore, compared with a package substrate formed by a press-fit process, the package substrate 1 constituted by the dielectric layer 11 and the metal wiring layer 12, provided by the examples of the present disclosure, has a smaller thickness, a smaller spacing between the adjacent metal wiring layers 12, and thus a higher integration rate of the metal lines in the metal wiring layer 12.

Optionally, The number of metal wiring layers 12 may be 4 or 5. FIG. 4 illustrates 4 metal wiring layers 12.

The dielectric layer 11 may be made from, for example, an insulating resin material, which for example, includes but is not limited to polybenzoxazole (PBO), polyimide (PI), and the like.

The metal wiring layer 12 may be made from, for example, a conductive material, which for example, includes but is not limited to gold, silver, copper, aluminum, and the like.

In some examples, as shown in FIG. 4, the package substrate 1 may further include a solder resist layer 13. For example, the number of solder resist layers 13 may be two. The plurality of dielectric layers 11 and the plurality of metal wiring layers 12 form a stacked structure, and the two solder resist layers 13 are located on the front side and the back side of the stacked structure respectively.

The solder resist layer 13 may not only play the role of insulation, but also protect the package substrate 1 and prevents the metal lines in the package substrate 1 from being oxidized.

Optionally, the solder resist layer 13 may be made from an organic material, for example, a solder resist ink, as long as it can play the role of insulation, which is not limited in the examples of the present disclosure.

In some examples, as shown in FIG. 4, the package substrate 1 has a first surface A and a second surface B that are opposite to each other. The first surface is an upper surface of the package substrate shown in FIG. 4 and the second surface is a lower surface of the package substrate shown in FIG. 4.

As shown in FIG. 4, the first surface A of the package substrate 1 is provided with a first pad 14 and a second pad 15 disposed at an interval. There may be a plurality of first pads 14 and a plurality of second pads 15. FIG. 4 illustrates nine first pads 14 and two second pads 15.

In some examples, both of the first pads 14 and the second pads 15 are located in the uppermost metal wiring layer 12 of the package substrate 1. The solder resist layer 13 is also provided with a plurality of vias, each of which exposes one first pad 14 or one second pad 15.

In some examples, as shown in FIG. 4, the first chip 2 is located on the first surface A of the package substrate 1 and electrically connected to the package substrate 1.

Optionally, the first chip 2 is electrically connected to the first pad 14 on the package substrate 1.

In some examples, in the top views shown in FIGS. 2 and 3, the first chip 2 may be disposed in the middle of the package substrate 1, and accordingly, each first pad 14 may be located in the middle of the package substrate 1. The first chip 2 and the first pad 14 may be electrically connected by a soldering process. For example, the soldering process may be a hot pressure soldering process, an ultrasonic pressure soldering process or a thermosonic soldering process. Of course, the first chip 2 and the first pad 14 may also be electrically connected by other means, which is not limited in the examples of the present disclosure.

In some examples, as shown in FIG. 4, the chip package structure 100 further includes a conductive pillar 6. The conductive pillar 6 is located on the first surface A of the package substrate 1 and electrically connected to the package substrate 1.

Optionally, the conductive pillar 6 is electrically connected to the second pad 15 on the package substrate 1.

In some examples, the conductive pillar 6 may be made of at least one of metal copper, metal aluminum, metal silver, or tin.

In some examples, the conductive pillar 6 may be columnar, such as cylindrical and prismatic. Of course, the conductive pillar 6 may also be in other irregular shapes, which is not limited in the examples of the present disclosure.

In some examples, as shown in FIG. 4, the second chip 4 is located on the side of the first chip 2 and the conductive pillar 6 away from the package substrate 1. The second chip 4 is electrically connected to the conductive pillar 6 and is not in direct electrical connection with the first chip 2.

The electrical connection between the second chip 4 and the conductive pillar 6 may be realized in various ways. For example, in an example of the present disclosure, the second chip 4 may be electrically connected to the conductive pillar 6 by means of flip-chip bonding.

It can be understood that flip-chip bonding refers to a process of forming bumps on a connect pad of a chip and directly connecting the bumps to a PCB substrate or a metal substrate. Specifically, in an example of the present disclosure, the second chip 4 and the conductive pillar 6 are electrically connected by means of flip-chip bonding, which means that bumps are formed on a connect pad of the second chip 4 and directly connected to the conductive pillar 6.

In some examples, as shown in FIG. 4, the second chip 4 includes a body 40 and a pin 41 located below the body 40. At this time, the chip package structure 100 further includes a first pad 61 located between the pin 41 and the conductive pillar 6. The second chip 4 is electrically connected to the conductive pillar 6 by the first pad 61. For example, the pin 41 refers to the connect pad, and the first pad 61 refers to the bump.

The pin 41 may be made from at least one of copper, titanium, nickel, tungsten and silver for example. The first pad 61 may be made from tin for example. The second chip 4 may be electrically connected to the conductive pillar 6 by a soldering process. In some examples, the soldering process may be a hot pressure soldering method, an ultrasonic pressure soldering method, a thermosonic soldering process, or the like.

In some examples, an orthographic projection of the conductive pillar 6 on the package substrate 1 is located within an orthographic projection of the first chip 2 or the second chip 4 on the package substrate 1. For example, it can be seen from FIGS. 2 and 3 that the second chip 4 may completely cover the conductive pillar 6, and the conductive pillar 6 is located within the boundary of the orthographic projection of the second chip 4 on the package substrate 1.

In the case that the orthographic projection of the conductive pillar 6 on the package substrate 1 is located within the orthographic projection of the second chip 4 on the package substrate 1, the conductive pillar 6 may provide support for the second chip 4, so as to improve the stability of the second chip 4 and further improve the structure stability of the chip package structure 100.

Since the conductive pillar 6 is located below the second chip 4 and electrically connected to a surface on a side of the second chip 4 close to the package substrate 1, the conductive pillar 6 may extend in a direction perpendicular to the first surface A of the package substrate 1 to be in a vertical state. The length of a path of signal transmission between the second chip 4 and the package substrate 1 substantially equals the height of the conductive pillar 6, or, substantially equals the distance between the first surface A and the surface on the side of the second chip 4 close to the package substrate 1. In this way, the path of signal transmission between the first chip 2 and the second chip 4 can be greatly shortened and the rate of signal transmission can be greatly improved.

In addition, the cross-sectional area of the conductive pillar 6 is larger than that of the gold wire, and correspondingly, the resistance of the conductive pillar 6 is lower than that of the gold wire, which helps to further improve the rate of signal transmission.

In the case that the orthographic projection of the conductive pillar 6 on the package substrate 1 is located within the orthographic projection of the first chip 2 on the package substrate 1, the orthographic projection of the conductive pillar 6 on the package substrate 1 may also be located within the orthographic projection of the first chip 2 on the package substrate 1. At this time, the area of the orthographic projection of the first chip 2 on the package substrate 1 may be greater than the area of the orthographic projection of the second chip 4 on the package substrate 1, and the conductive pillar 6 may be electrically connected to the second chip 4 after running through the first chip 2.

Therefore, in the chip package structure 100 according to some examples of the present disclosure, the second chip 4 is placed above the first chip 2, such that the package substrate 1, the first chip 2, the conductive pillar 6 and the second chip 4 form a stacked structure, which improves the compactness of the chip package structure 100 and helps to reduce the area of the chip package structure 100. Moreover, by providing the conductive pillar 6 to realize the electrical connection between the second chip 4 and the package substrate 1, and by disposing the conductive pillar 6 below the first chip 2 or the second chip 4, the orthographic projection of the conductive pillar 6 on the package substrate 1 is located within the range of the orthographic projection of the first chip 2 or the second chip 4 on the package substrate 1. In this way, the space around the first chip 2 or the second chip 4 may not be occupied, which helps to further miniaturize the chip package structure 100 and to further reduce the area of the chip package structure 100.

In addition, the effective length of the conductive pillar 6 substantially equals the distance between the first surface A and the surface on the side of the second chip 4 close to the package substrate 1. Compared with the electrical connection between the second chip 4 and the package substrate 1 realized by the gold wires, the path of signal transmission between the first chip 2 and the second chip 4 in the example of the present application is shortened, which helps to improve the rate of signal transmission. Moreover, compared with the gold wire, the conductive pillar 6 is larger in size and lower in resistance, which helps to further improve the rate of signal transmission between the first chip 2 and the second chip 4. Accordingly, the chip package structure 100 can be improved in response speed and reduced in power consumption, and electricity can be saved.

It should be noted that in the case the area of the second chip is larger than that of the first chip, in the chip package structure, the size of the package plane is approximate to the size of the area of the second chip, for example.

In some examples, as shown in FIG. 4, a surface on a side of the second chip 4 close to the package substrate 1 is higher than a surface on a side of the first chip 2 away from the package substrate 1, with respect to the first surface A of the package substrate 1. That is, there is a certain distance between the surface on the side of the second chip 4 close to the package substrate 1 and the surface on the side of the first chip 2 away from the package substrate 1. That is, the first chip 2 and the second chip 4 are disposed at intervals in a direction perpendicular to the first surface A.

In some examples, the distance between the surface on the side of the second chip 4 close to the package substrate 1 and the surface on the side of the first chip 2 away from the package substrate 1 is greater than or equal to 20 μm. For example, the distance may be 20 μm, 30 μm, 40 μm, 50 μm, 60 μm, 70 μm, etc. The "distance" herein refers to a distance in a direction perpendicular to the first surface.

With the above arrangement, signal interference between the second chip 4 and the first chip 2 can be avoided, which helps to improve the reliability and reliability of the chip package structure 100.

Optionally, relative to the first surface A of the package substrate 1, ends of the conductive pillars 6 away from the package substrate 1 are higher than the surface on the side of the first chip 2 away from the package substrate 1.

In some examples, as shown in FIG. 4, the distance between the surface on the side of the second chip 4 close to the package substrate 1 and the first surface A of the package substrate 1 is h1, the distance between the surface on the side of the first chip 2 away from the package substrate 1 and the first surface A of the package substrate 1 is h2, and h1 and h2 meet:

$$\frac{5}{8} \leq \frac{h2}{h1} \leq \frac{4}{5}.$$

In some examples, a value of $$\frac{h2}{h1}$$

may be, for example, $$\frac{5}{8}, \frac{5}{7}, \frac{7}{10}, \frac{3}{4}, \frac{4}{5},$$

etc.

In some examples, the distance between the surface on the side of the first chip 2 away from the package substrate 1 and the first surface A of the package substrate 1 ranges from 50 μm to 80 μm. At this point, the distance between the surface on the side of the second chip 4 close to the package substrate 1 and the first surface A of the package substrate 1 may be 70 μm to 110 μm. For example, when the distance between the surface on the side of the first chip 2 away from the package substrate 1 and the first surface A of the package substrate 1 is 50 μm, the distance between the surface on the side of the second chip 4 close to the package substrate 1 and the first surface A of the package substrate 1 may be 70 μm. For another example, when the distance between the surface on the side of the first chip 2 away from the package substrate 1 and the first surface A of the package substrate 1 is 80 μm, the distance between the surface on the side of the second chip 4 close to the package substrate 1 and the first surface A of the package substrate 1 may be 110 μm.

With the above arrangement, a certain distance can be ensured between the first chip 2 and the second chip 4, thereby avoiding signal interference between the first chip 2 and the second chip 4. On this basis, the distance between the first chip 2 and the second chip 4 can also be prevented from being too large, which ensures a thin and light structure of the chip package structure 100.

In some examples, as shown in FIG. 2 and FIG. 3, a number of conductive pillars 6 is greater than one. The plurality of conductive pillars 6 are at least located on two opposite sides of the first chip 2. For example, the plurality of conductive pillars 6 are located on two opposite sides of the first chip 2 (as shown in FIG. 2); or the plurality of conductive pillars 6 are located on three or four sides of the first chip 2 (as shown in FIG. 3).

In some examples, the number of the conductive pillars 6 located on different sides of the first chip 2 may be the same or different. The plurality of conductive pillars 6 located on the same side of the first chip 2 may be regularly arranged in at least one column; of course, the plurality of conductive pillars 6 located on the same side of the first chip 2 may also be disposed in a staggered way, which is not limited by the example of the present disclosure.

In the present example, the plurality of conductive pillars 6 are at least disposed on two opposite sides of the first chip 2, which can not only ensure electrical connection between the second chip 4 and the package substrate 1, but also provide a relatively balanced supporting force for the second chip 4 and ensure structure stability of the second chip 4.

Figure 5:
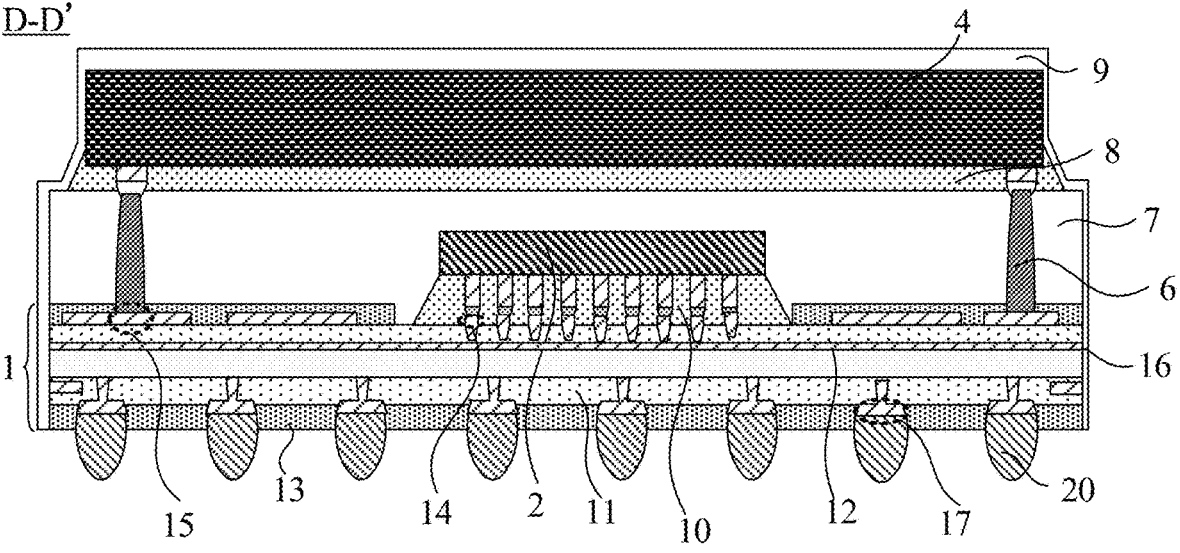
FIG. 5 is a sectional structure diagram of the chip package structure shown in FIG. 2 in a D-D' direction.
Figure 6:
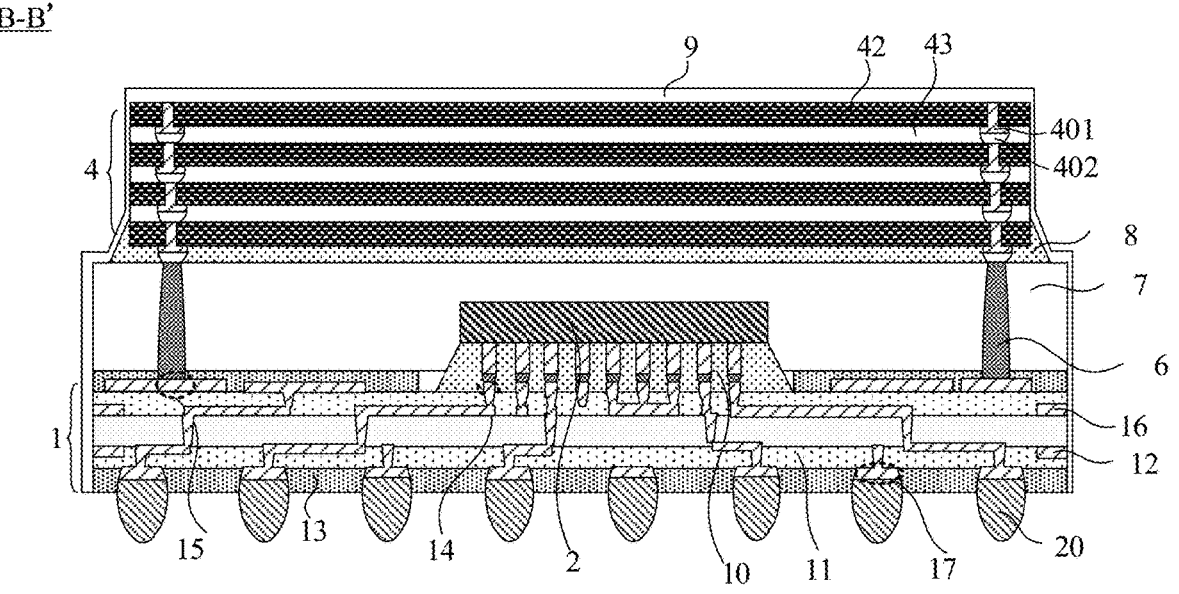
FIG. 6 is another sectional structure diagram of the chip package structure shown in FIG. 2 in the B-B' direction.

In some examples, as shown in FIG. 5 and FIG. 6, the chip package structure 100 further includes a package layer 7. The package layer 7 is located between the package substrate 1 and the second chip 4, covers the first chip 2, and surrounds sides of the conductive pillars 6.

In some examples, the package layer 7 is a whole layer structure, a surface on a side of the package layer 7 away from the package substrate 1 is, for example, a flat surface, this surface is, for example, flush with the surfaces on the side of the conductive pillars away from the package substrate 1, and the package layer 7 exposes the surfaces on the side of the conductive pillars 6 away from the package substrate 1.

In some examples, the area of an orthographic projection of the package layer 7 on the package substrate 1 is basically coincident with the area of the first surface A of the package substrate 1; and a boundary of the orthographic projection of the package layer 7 on the package substrate 1 is basically coincident with a boundary of the first surface A of the package substrate 1.

In some examples, a material of the package layer 7 may be a molding compound material. At this point, the package layer 7 may be formed by a molding process. The material of the package layer 7 may also be other materials, which is not limited by the example of the present disclosure.

With the above arrangement, not only may the first chip 2 be packaged by the package layer 7, but also the package layer 7 is in contact with the sides of the conductive pillars 6 to provide physical protection for the first chip 2 and the conductive pillars 6, and to fix the positions of the first chip 2 and the conductive pillars 6 on the package substrate, which ensures structure integrity and stability of the chip package structure 100.

In some examples, as shown in FIG. 5 and FIG. 6, the orthographic projection of the second chip 4 on the package substrate 1 is located within the range of the orthographic projection of the package layer 7 on the package substrate 1.

For example, an area of the orthographic projection of the second chip 4 on the package substrate 1 is less than an area of the orthographic projection of the package layer 7 on the package substrate 1. A boundary of the orthographic projection of the package layer 7 on the package substrate 1 surrounds a boundary of the orthographic projection of the second chip 4 on the package substrate 1, and there is a certain distance between the two boundaries.

With the above arrangement, the package layer 7 can provide certain support for the second chip 4.

In some examples, as shown in FIG. 5 and FIG. 6, the chip package structure 100 further includes a first filling portion 8. At least part of the first filling portion 8 is located between the package layer 7 and the second chip 4, and the first filling portion 8 surrounds each pin of the second chip 4.

For example, the first filling portion 8 is located between the package layer 7 and the second chip 4, and the second chip 4 covers the first filling portion 8. Alternatively, the first filling portion 8 is located not only between the package layer 7 and the second chip 4, but also on both sides of the second chip 4, and the orthographic projection of the second chip 4 on the package substrate 1 is located within the range of an orthographic projection of the first filling portion 8 on the package substrate 1.

The first filling portion 8 is filled between any two adjacent pins of the second chip 4, so as to avoid short circuit between the two adjacent pins.

For example, a material of the first filling portion 8 may be an epoxy resin material or the like. When the epoxy resin material or the like is filled between the package layer 7 and the second chip 4 to form the first filling portion 8, a hole may be formed, and an area of the hole is, for example, less than or equal to 15%.

In the present example, by disposing the first filling portion 8 between the package layer 7 and the second chip 4, not only can the support be provided for the second chip 4, but also the bonding force between the second chip 4 and the package layer 7 is enhanced, and the structure stability of the second chip 4 is ensured, thereby improving the reliability of the chip package structure 100. The short circuit between any two adjacent pins of the second chip 4 can also be avoided, which ensures a yield of the chip package structure 100.

In some examples, as shown in FIG. 5 and FIG. 6, the chip package structure 100 further includes an electromagnetic shielding layer 9. The electromagnetic shielding layer 9 at least covers the second chip 4 as well as the sides of the package layer 7.

For example, the electromagnetic shielding layer 9 covers the second chip 4 as well as the sides of the package layer 7. Alternatively, the electromagnetic shielding layer 9 covers not only the second chip 4 as well as the sides of the package layer 7, but also other components, for example, the electromagnetic shielding layer 9 also covers the sides of the first filling portion 8, etc., which is not limited by the example of the present disclosure.

For example, the electromagnetic shielding layer 9 is made of a ferromagnetic material (such as steel) with a very high magnetic permeability, and the electromagnetic shielding layer 9 may electromagnetically shield a covered region thereof.

By disposing the electromagnetic shielding layer 9, the first chip 2 and the second chip 4 can be effectively prevented from being subjected to electromagnetic interference, thereby improving an anti-electromagnetic interference capability of the chip package structure 100.

In some examples, as shown in FIG. 5 and FIG. 6, the package substrate 1 further includes at least one ground wire 16. The ground wire 16 is located on the metal wiring layer 12.

In some examples, as shown in FIG. 5 and FIG. 6, the electromagnetic shielding layer 9 also covers the sides of the package substrate 1, and is electrically connected to the ground wire 16.

In the present example, the electromagnetic shielding layer 9 covers the second chip 4 as well as the sides of the package layer 7 and the sides of the package substrate 1 to electromagnetically shield the chip package structure 100 and effectively prevent the electromagnetic interference. Furthermore, the electromagnetic shielding layer 9 is further electrically connected to the ground wire 16, and can lead electromagnetic radiation out through grounding, which realizes double anti-electromagnetic interference and further ensures efficient operation of the chip package structure 100. At this point, the anti-electromagnetic interference capability of the chip package structure 100 is realized by the electromagnetic shielding layer 9, which is low in process cost, simple and convenient to implement and suitable for mass production.

In some examples, as shown in FIG. 6, the second chip 4 includes a plurality of sub-chips 42. For example, the plurality of sub-chips 42 are sequentially stacked in a direction perpendicular to the package substrate 1 and away from the package substrate 1. For example, types of the plurality of sub-chips are the same, and optionally, the sub-chips are all memory chips.

In some examples, an isolation structure 43 is disposed between two adjacent sub-chips 42. A material of the isolation structure 43 may be an adhesive material. Two adjacent sub-chips 42 are connected by the adhesive material.

In some other examples, one sub-chip 42 close to the package substrate 1 in the plurality of sub-chips 42 is electrically connected to the conductive pillar 6, thereby realizing electrical connection with the package substrate 1 through the conductive pillar. Other sub-chips 42 are electrically connected to the package substrate 1 through a wire by a wire bonding process.

For example, each sub-chip 42 is respectively electrically connected to the package substrate 1, so that each sub-chip 42 respectively communicates with the first chip 2. At this point, each sub-chip 42 can store different information under control of the first chip 2, which ensures storage diversity of the chip package structure 100.

In some other examples, as shown in FIG. 6, two adjacent sub-chips 42 are electrically connected. For example, two adjacent sub-chips 42 may be connected to each other by a gold wire. For another example, the sub-chip 42 includes a sub-pin 401, and the chip package structure 100 further includes a second pad 402 located between two adjacent sub-chips 42. As shown in FIG. 6, two adjacent sub-chips 42 are electrically connected through the pin and the second pad 402.

For example, a material of the sub-pin 401 includes at least one of metal copper, titanium, nickel, tungsten and silver. A material of the second pad 402 may include tin. At this point, two adjacent sub-chips 42 may be electrically connected by a soldering process.

For example, the soldering process may be a hot-press soldering method, an ultrasonic pressure soldering method, a thermal ultrasonic soldering method or the like.

In the present example, by stacking the plurality of sub-chips 42 to form the second chip 4, an integration degree of the chip package structure 100 can be improved and product performances of the chip package structure 100 can be improved on the basis of ensuring a smaller package area.

It should be noted that the first chip 2 may also include a plurality of sub-chips. When the first chip 2 includes the plurality of sub-chips, the plurality of sub-chips may be sequentially stacked in a direction away from the package substrate 1.

In some examples, as shown in FIG. 5 and FIG. 6, the chip package structure 100 further includes a second filling portion 10. At least part of the second filling portion 10 is located between the package substrate 1 and the first chip 2, and the second filling portion 10 surrounds each pin of the first chip 2.

For example, the second filling portion 10 is located between the package substrate 1 and the first chip 2, and the first chip 2 covers the second filling portion 10. Alternatively, the second filling portion 10 is located not only between the package substrate 1 and the first chip 2, but also on both sides of the first chip 2, and the orthographic projection of the first chip 2 on the package substrate 1 is located within the range of an orthographic projection of the second filling portion 10 on the package substrate 1.

The second filling portion 10 is filled between any two adjacent pins of the first chip 2, so as to avoid short circuit between the two adjacent pins.

For example, a material of the second filling portion 10 is an epoxy resin material or the like.

When the epoxy resin material or the like is filled between the package substrate 1 and the first chip 2 to form the second filling portion 10, a hole may be formed, and an area of the hole is, for example, less than or equal to 15%.

In the present example, by disposing the second filling portion 10 between the package substrate 1 and the first chip 2, not only can the support be provided for the first chip 2, but also the bonding force between the first chip 2 and the package substrate 1 is enhanced, and structure stability of the first chip 2 is ensured, thereby improving the reliability of the chip package structure 100. The short circuit between any two adjacent pins of the first chip 2 can also be avoided, which ensures the yield of the chip package structure 100.

In some examples, as shown in FIG. 4, FIG. 5 and FIG. 6, the second surface B of the package substrate 1 is provided with third pads 17. The third pads 17 are located on the metal wiring layers 12. For example, a number of third pads 17 is greater than one.

For example, the solder resist layers 13 are provided with a plurality of vias, and each via exposes one third pad 17.

In some examples, as shown in FIG. 4, FIG. 5 and FIG. 6, the chip package structure 100 further includes solder balls 20. A number of solder balls 20 is greater than one, and the plurality of solder balls 20 are located on the second surface B of the package substrate 1 and electrically connected to the package substrate 1.

Optionally, the solder balls 20 are electrically connected to the third pads 17 on the package substrate 1. The plurality of solder balls 20 and the plurality of third pads 17 may be disposed in one-to-one correspondence.

For example, the solder balls 20 may be soldered on the third pads 17 by a ball planting process.

The solder balls 20 are electrically connected to the metal wires in the package substrate 1 through the third pads 17. At this point, the solder ball 20 may serve as an interface between the package substrate 1 and outside world, which realizes electrical connection between the chip package structure 100 and an external module, and further realizes communication between the chip package structure 100 and the external module.

For example, when the integration rate of the metal wires in the package substrate 1 is very high, a signal transmission path between the solder balls 20 and the metal wires in the package substrate 1 is shortened, which improves the signal transmission speed.

For example, the pins (i.e., input/output (I/O) terminals) of the first chip 2 are redistributed through the package substrate 1 and the plurality of solder balls 20 located on the second surface B of the package substrate 1. At this point, the chip package structure 100 is a fan-out chip package structure, and the fan-out chip package structure is connected to the external module (such as a motherboard or a printed circuit board) through the solder balls 20.

Figure 7:
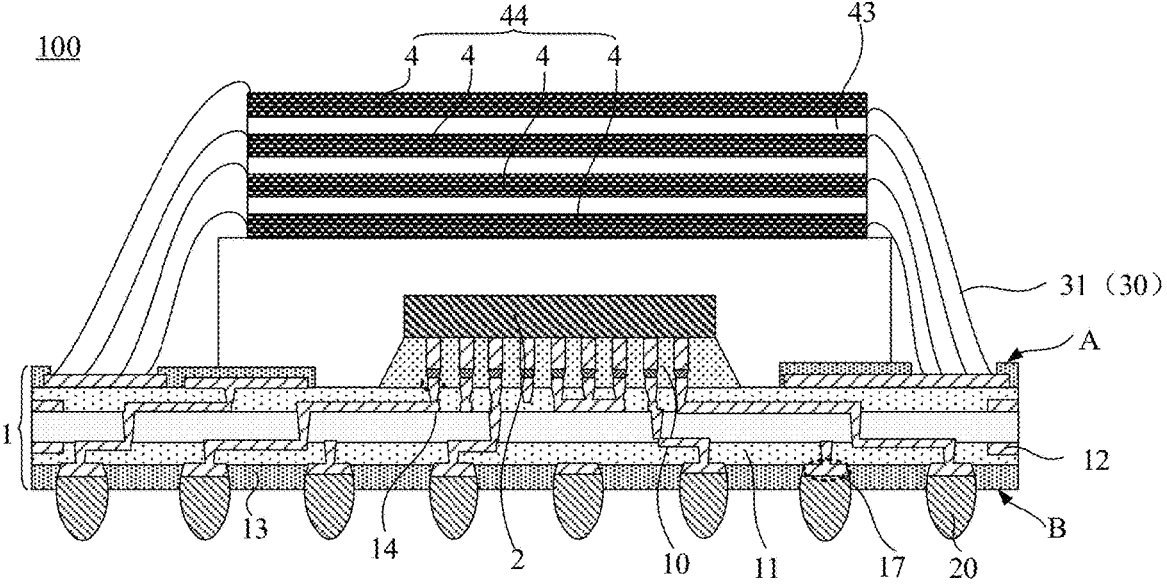
FIG. 7 is a schematic structure diagram of yet another chip package structure according to some examples.
Figure 8:
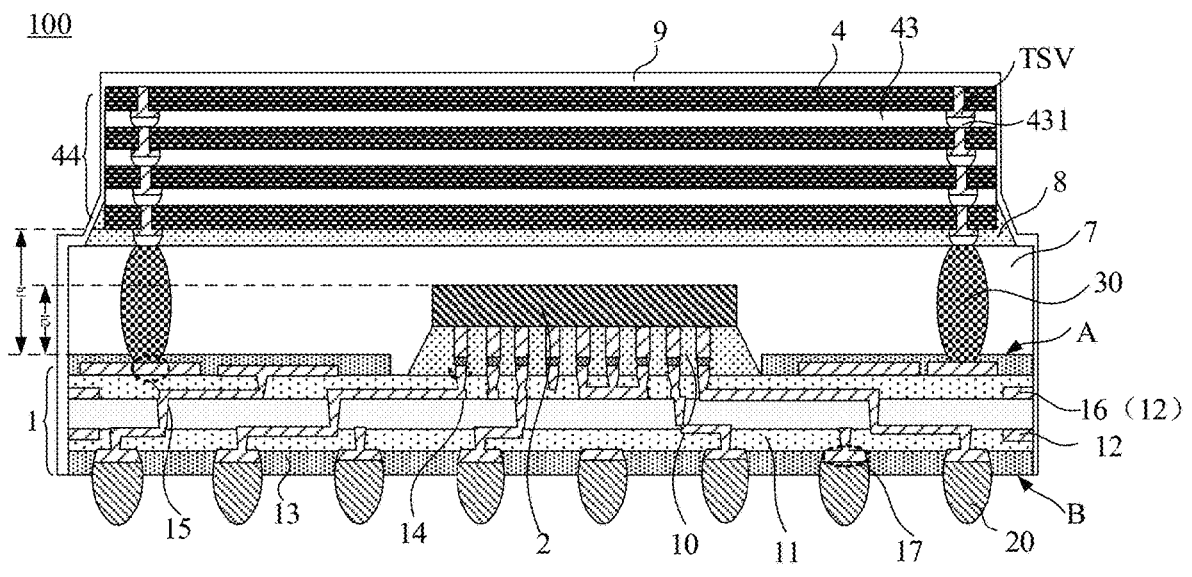
FIG. 8 is a schematic structure diagram of still another chip package structure according to some examples.

The example of the present disclosure also provides another chip package structure 100. As shown in FIG. 7 and FIG. 8, the chip package structure 100 includes the first chip 2 and a second chipset 44. The second chipset 44 includes a plurality of second chips 4. The plurality of second chips 4 are, for example, sequentially stacked in the direction perpendicular to the package substrate 1 and away from the package substrate 1.

The first chip 2 and the second chip 4 may have different functions. For example, the first chip 2 may be a controller and the second chip 4 may be a memory chip. The memory chip has a memory structure for providing a memory function. There are many types of memory chips. For example, the memory chip includes but not limited to a Nand chip, a resistive memory chip, a dynamic random-access memory and the like. Of course, the first chip 2 may also be the memory chip, and the second chip 4 may be the controller, which are not limited by the example of the present disclosure.

In some examples, the chip package structure 100 further includes the package substrate 1. The package substrate 1 is rigid, and thus can provide support for the first chip 2 and the second chip 4.

For example, as shown in FIGS. 7 and 8, the package substrate 1 includes a plurality of dielectric layers 11 and a plurality of metal wiring layers 12, which are alternately disposed. One metal wiring layer 12 is disposed between two adjacent dielectric layers 11, and one dielectric layer 11 is disposed between two adjacent metal wiring layers 12. Each metal wiring layer 12 includes a metal line, and the metal lines in two adjacent metal wiring layers 12 may run through the dielectric layer 11 between the two metal wiring layers 12 and be connected as required.

In some examples, the dielectric layer 11 in the package substrate 1 is formed by a spin coating process, and the metal wiring layer 12 in the package substrate 1 is formed by a physical vapor deposition (PVD) process in combination with an electroplating process. Therefore, compared with a package substrate formed by a press-fit process, the package substrate 1 constituted by the dielectric layer 11 and the metal wiring layer 12, provided by the examples of the present disclosure, has a smaller thickness, a smaller spacing between the adjacent metal wiring layers 12, and thus a higher integration rate of the metal lines in the metal wiring layer 12.

Optionally, the number of metal wiring layers 12 may be 4 or 5. FIG. 7 illustrates 4 metal wiring layers 12.

The dielectric layer 11 may be made from, for example, an insulating resin material, which for example, includes but is not limited to polybenzoxazole (PBO), polyimide (PI), and the like.

The metal wiring layer 12 may be made from, for example, a conductive material, which for example, includes but is not limited to gold, silver, copper, aluminum, and the like.

For example, as shown in FIG. 7, the package substrate 1 may further include a solder resist layer 13. For example, the number of solder resist layers 13 may be two. The plurality of dielectric layers 11 and the plurality of metal wiring layers 12 form a stacked structure, and the two solder resist layers 13 are located on the front side and the back side of the stacked structure respectively.

The solder resist layer 13 may not only play the role of insulation, but also protect the package substrate 1 and prevents the metal lines in the package substrate 1 from being oxidized.

Optionally, the solder resist layer 13 may be made from an organic material, for example, a solder resist ink, as long as it can play the role of insulation, which is not limited in the examples of the present disclosure.

In some examples, as shown in FIGS. 7 and 8, the package substrate 1 has a first surface A and a second surface B that are opposite to each other. The first surface is an upper surface of the package substrate shown in FIGS. 7 and 8 and the second surface is a lower surface of the package substrate shown in FIGS. 7 and 8.

As shown in FIGS. 7 and 8, the first surface A of the package substrate 1 is provided with a first pad 14 and a second pad 15 disposed at an interval. There may be a plurality of first pads 14 and a plurality of second pads 15. FIG. 8 illustrates nine first pads 14 and two second pads 15.

For example, both of the first pads 14 and the second pads 15 are located in the uppermost metal wiring layer 12 of the package substrate 1. The solder resist layer 13 is also provided with a plurality of vias, each of which exposes one first pad 14 or one second pad 15.

In some examples, as shown in FIGS. 7 and 8, the first chip 2 is located on the first surface A of the package substrate 1 and electrically connected to the package substrate 1.

Optionally, the first chip 2 is electrically connected to the first pad 14 on the package substrate 1.

For example, the first chip 2 and the first pad 14 may be electrically connected by a soldering process. For example, the soldering process may be a hot pressure soldering process, an ultrasonic pressure soldering process or a thermosonic soldering process. Of course, the first chip 2 and the first pad 14 may also be electrically connected by other means, which is not limited in the examples of the present disclosure.

In some examples, as shown in FIG. 7 and FIG. 8, the second chipset 44 is located on a side of the first chip 2 away from the package substrate 1. The second chipset 44 is electrically connected to the package substrate 1, and has no direct electrical connection with the first chip 2.

The second chipset 44 and the package substrate 1 may be electrically connected in various ways. For example, the second chipset 44 and the package substrate 1 may be electrically connected through conductive structures 30.

The conductive structures 30 are electrically connected to the package substrate 1 and the second chipset 44.

For example, as shown in FIG. 7, the conductive structures 30 may include wires 31. Ends of the wires 31 are electrically connected to the second chipset 44, and the other ends of the wires 31 are electrically connected to the exposed metal wiring layers 12 on the package substrate 1, so that the second chipset 44 is electrically connected to the package substrate 1 by bonding leads to the wires 31. At this point, a material of the wires may include at least one of metal gold, metal aluminum, metal silver or metal copper.

As a further example, as shown in FIG. 8, the shape of the conductive structure 30 may be columnar, for example, cylindrical, prismatic, etc. Of course, the shape of the conductive pillar 6 may also be other irregular shapes, which is not limited by the example of the present disclosure. At this point, the material of the conductive structure 30 may include at least one of metal copper, metal aluminum, metal silver or tin.

Therefore, in the chip package structure 100 according to some examples of the present disclosure, the second chipset 44 is placed above the first chip 2, so that the package substrate 1, the first chip 2 and the second chipset 44 form a stacked structure, which improves the compactness of the chip package structure 100 and helps to reducing the area of the chip package structure 100. Furthermore, by stacking the plurality of second chips 4 to form the second chipset 44, the integration degree of the chip package structure 100 can be improved and the product performances of the chip package structure 100 can be improved on the basis of ensuring a smaller package area.

For example, the isolation structure 43 is disposed between two adjacent second chips 4. The material of the isolation structures 43 may be an adhesive material. Two adjacent second chips 4 are connected by the adhesive material.

In some examples, two adjacent second chips 4 are electrically connected. Two adjacent second chips 4 may be electrically connected in various ways.

For example, two adjacent second chips 4 may be connected to each other by a wire. The material of the wire may include at least one of metal gold, metal aluminum, metal silver or metal copper.

For another example, the second chip 4 has a through silicon via (TSV), and the TSV is filled with a conductive material. The chip package structure 100 further includes a third pad 431 located between two adjacent second chips 4. As shown in FIG. 8, the conductive metal at the TSV and the third pad 431 may be electrically connected by a soldering process, thereby realizing electrical connection between two connected second chips 4.

For another example, the second chip 4 may include a body and pins located below the body. At this point, the chip package structure 100 further includes pads located on the pins and another second chip 4. The second chip 4 is electrically connected to another second chip 4 through the pads.

With the above arrangement, on the basis of ensuring a smaller package area, the plurality of second chips 4 can be directly connected to each other, which shortens the signal transmission path between adjacent second chips 4 and improving the signal transmission speed.

In some other examples, as shown in FIG. 7, in the plurality of second chips 4, each second chip 4 is electrically connected to the package substrate 1 through the wire 31.

For example, each second chip 4 is respectively electrically connected to the package substrate 1, so that each second chip 4 respectively communicates with the first chip 2. At this point, each second chip 4 can store different information under control of the first chip 2, which ensures storage diversity of the chip package structure 100.

It should be noted that there may also be a plurality of the first chips 2. When there are a plurality of first chips 2, the plurality of first chips 2 may be sequentially stacked in the direction away from the package substrate 1.

In some examples, as shown in FIG. 7 and FIG. 8, relative to the first surface A of the package substrate 1, a surface on a side of the second chipset 44 close to the package substrate 1 is higher than a surface on a side of the first chip 2 away from the package substrate 1. That is, there is a certain distance between the surface on the side of the second chipset 44 close to the package substrate 1 and the surface on the side of the first chip 2 away from the package substrate 1. That is, in the direction perpendicular to the first surface A, the first chip 2 and the second chipset 44 are disposed at intervals.

For example, the distance between the surface on the side of the second chipset 44 close to the package substrate 1 and the surface on the side of the first chip 2 away from the package substrate 1 is greater than or equal to 20 µm. For example, the distance may be 20 µm, 30 µm, 40 µm, 50 µm, 60 µm, 70 µm, etc. The "distance" here refers to the distance in the direction perpendicular to the first surface.

With the above arrangement, signal interference between the second chipset 44 and the first chip 2 can be avoided, which is beneficial to improving the credibility and reliability of the chip package structure 100.

In some examples, as shown in FIG. 8, the distance between the surface on the side of the second chipset 44 close to the package substrate 1 and the first surface A of the package substrate 1 is h1, the distance between the surface on the side of the first chip 2 away from the package substrate 1 and the first surface A of the package substrate 1 is h2, and h1 and h2 meet:

$$\frac{5}{8} \le \frac{h2}{h1} \le \frac{4}{5}.$$

For example, a value of $$\frac{h2}{h1}$$

may be, for example, $$\frac{5}{8}, \frac{5}{7}, \frac{7}{10}, \frac{3}{4}, \frac{4}{5},$$

etc.

In some examples, the distance between the surface on the side of the first chip 2 away from the package substrate 1 and the first surface A of the package substrate 1 ranges from 50 µm to 80 µm. At this point, the distance between the surface on the side of the second chipset 44 close to the package substrate 1 and the first surface A of the package substrate 1 may be 70 µm to 110 µm. For example, when the distance between the surface on the side of the first chip 2 away from the package substrate 1 and the first surface A of the package substrate 1 is 50 µm, the distance between the surface on the side of the second chipset 44 close to the package substrate 1 and the first surface A of the package substrate 1 may be 70 µm. For another example, when the distance between the surface on the side of the first chip 2 away from the package substrate 1 and the first surface A of the package substrate 1 is 80 µm, the distance between the surface on the side of the second chipset 44 close to the package substrate 1 and the first surface A of the package substrate 1 may be 110 µm.

With the above arrangement, a certain distance can be ensured between the first chip 2 and the second chipset 44, and then the signal interference between the first chip 2 and the second chipset 44 can be avoided. On this basis, the distance between the first chip 2 and the second chipset 44 can be prevented from being too large, which ensures the thin and light structure of the chip package structure 100.

In some examples, as shown in FIG. 7 and FIG. 8, the chip package structure 100 further includes the package layer 7. The package layer 7 is located between the package substrate 1 and the second chipset 44, and the package layer 7 covers the first chip 2.

For example, the package layer 7 is a whole layer structure, and the surface on the side of the package layer 7 away from the package substrate 1 is, for example, a flat surface. When the shape of the conductive structure 30 is columnar, the surface on the side of the package layer 7 away from the package substrate 1 is, for example, flush with the surface on the side of the conductive structure 30 away from the package substrate 1, and the package layer 7 exposes the surface on the side of the conductive structure 30 away from the package substrate 1.

For example, the area of the orthographic projection of the package layer 7 on the package substrate 1 is basically consistent with the area of the first surface A of the package substrate 1; and the boundary of the orthographic projection of the package layer 7 on the package substrate 1 is basically coincident with the boundary of the first surface A of the package substrate 1.

For example, the material of the package layer 7 may be a molding compound material. At this point, the package layer 7 may be formed by a molding process. The material of the package layer 7 may also be other materials, which is not limited by the example of the present disclosure.

With the above arrangement, not only can the first chip 2 be packaged by the package layer 7, but also the first chip 2 can be physically protected by the package layer 7, and the position of the first chip 2 on the package substrate can be fixed to ensure the structure integrity and stability of the chip package structure 100.

In some examples, as shown in FIG. 7 and FIG. 8, an orthographic projection of the second chipset 44 on the package substrate 1 is located within the range of the orthographic projection of the package layer 7 on the package substrate 1.

For example, the area of the orthographic projection of the second chipset 44 on the package substrate 1 is less than the area of the orthographic projection of the package layer 7 on the package substrate 1. The boundary of the orthographic projection of the package layer 7 on the package substrate 1 surrounds a boundary of the orthographic projection of the second chipset 44 on the package substrate 1, and there is a certain distance between the two boundaries.

With the above arrangement, the package layer 7 can provide certain support for the second chipset 44.

In some examples, as shown in FIG. 7 and FIG. 8, the chip package structure 100 further includes the first filling portion 8. At least part of the first filling portion 8 is located between the package layer 7 and the second chipset 44, and the first filling portion 8 surrounds each pin of one second chip 4 close to the package substrate 1.

For example, the first filling portion 8 is located between the package layer 7 and the second chipset 44, and the second chipset 44 covers the first filling portion 8. Alternatively, the first filling portion 8 is located not only between the package layer 7 and the second chipset 44, but also on both sides of one second chip 4 close to the package substrate 1, and an orthographic projection of one second chip 4 close to the package substrate 1 on the package substrate 1 is located within the range of an orthographic projection of the first filling portion 8 on the package substrate 1.

The first filling portion 8 is filled between any two adjacent pins of one second chip 4 close to the package substrate 1 to avoid short circuit between the two adjacent pins.

For example, a material of the first filling portion 8 may be an epoxy resin material or the like. When the epoxy resin material or the like is filled between the package layer 7 and the second chipset 44 to form the first filling portion 8, a hole may be formed, and the area of the hole is, for example, less than or equal to 15%.

In the present example, by disposing the first filling portion 8 between the package layer 7 and the second chipset 44, not only can the support be provided for the second chipset 44, but also the bonding force between the second chipset 44 and the package layer 7 is enhanced, and structure stability of the second chipset 44 is ensured, thereby improving the reliability of the chip package structure 100. The short circuit between any two adjacent pins of one second chip 4 close to the package substrate 1 can also be avoided, thereby ensuring the yield of the chip package structure 100.

In some examples, as shown in FIG. 8, the chip package structure 100 further includes the electromagnetic shielding layer 9. The electromagnetic shielding layer 9 at least covers the second chipset 44 as well as sides of the package layer 7.

For example, the electromagnetic shielding layer 9 covers the second chipset 44 as well as sides of the package layer 7. Alternatively, the electromagnetic shielding layer 9 covers not only the second chipset 44 as well as sides of the package layer 7, but also other components, for example, the electromagnetic shielding layer 9 also covers sides of the first filling portion 8, etc., which is not limited by the example of the present disclosure.

For example, the electromagnetic shielding layer 9 is made of a ferromagnetic material (such as steel) with a very high magnetic permeability, and the electromagnetic shielding layer 9 may electromagnetically shield a covered region thereof.

By disposing the electromagnetic shielding layer 9, the first chip 2 and the second chipset 44 can be effectively prevented from being subjected to electromagnetic interference, thereby improving the anti-electromagnetic interference capability of the chip package structure 100.

In some examples, as shown in FIG. 8, the package substrate 1 further includes at least one ground wire 16. The ground wire 16 is located on the metal wiring layer 12.

In some examples, as shown in FIG. 8, the electromagnetic shielding layer 9 also covers the sides of the package substrate 1, and is electrically connected to the ground wire 16.

In the present example, the electromagnetic shielding layer 9 covers the second chipset 44 and the sides of the package layer 7 as well as the sides of the package substrate 1 to electromagnetically shield the chip package structure 100 and effectively prevent electromagnetic interference. Furthermore, the electromagnetic shielding layer 9 is electrically connected to the ground wire 16, and can lead electromagnetic radiation out through grounding, which realizes double anti-electromagnetic interference and ensures the efficient operation of the chip package structure 100. At this point, the anti-electromagnetic interference capability of the chip package structure 100 is realized by the electromagnetic shielding layer 9, which is low in process cost, simple and convenient to implement and suitable for mass production.

In some examples, as shown in FIG. 7 and FIG. 8, the chip package structure 100 further includes the second filling portion 10. At least part of the second filling portion 10 is located between the package substrate 1 and the first chip 2, and the second filling portion 10 surrounds each pin of the first chip 2.

For example, the second filling portion 10 is located between the package substrate 1 and the first chip 2, and the first chip 2 covers the second filling portion 10. Alternatively, the second filling portion 10 is located not only between the package substrate 1 and the first chip 2, but also on both sides of the first chip 2, and an orthographic projection of the first chip 2 on the package substrate 1 is located within the range of an orthographic projection of the second filling portion 10 on the package substrate 1.

The second filling portion 10 is filled between any two adjacent pins of the first chip 2, so as to avoid short circuit between the two adjacent pins.

For example, the material of the second filling portion 10 is an epoxy resin material or the like.

When the epoxy resin material or the like is filled between the package substrate 1 and the first chip 2 to form the second filling portion 10, a hole may be formed, and the area of the hole is, for example, less than or equal to 15%.

In the present example, by disposing the second filling portion 10 between the package substrate 1 and the first chip 2, not only can the support be provided for the first chip 2, but also the bonding force between the first chip 2 and the package substrate 1 is enhanced, and the structure stability of the first chip 2 is ensured, thereby improving the reliability of the chip package structure 100. The short circuit between any two adjacent pins of the first chip 2 can also be avoided, which ensures the yield of the chip package structure 100.

In some examples, as shown in FIG. 7 and FIG. 8, third pads 17 are disposed on the second surface B of the package substrate 1. The third pads 17 are located on the metal wiring layers 12. For example, a number of third pads 17 is greater than one.

For example, the solder resist layer 13 is provided with a plurality of vias, and each via exposes one third pad 17.

In some examples, as shown in FIG. 7 and FIG. 8, the chip package structure 100 further includes the solder balls 20. A number of solder balls 20 is greater than one, and the plurality of solder balls 20 are located on the second surface B of the package substrate 1 and electrically connected to the package substrate 1.

Optionally, the solder balls 20 are electrically connected to the third pads 17 on the package substrate 1. The plurality of solder balls 20 and the plurality of third pads 17 may be disposed in one-to-one correspondence.

For example, the solder balls 20 may be soldered on the third pads 17 by a ball planting process.

The solder balls 20 are electrically connected to the metal wires in the package substrate 1 through the third pads 17. At this point, the solder balls 20 may serve as an interface between the package substrate 1 and the outside world, which realizes the electrical connection between the chip package structure 100 and the external module, and further realizes the communication between the chip package structure 100 and the external module.

For example, when the integration rate of the metal wires in the package substrate 1 is very high, the signal transmission path between the solder balls 20 and the metal wires in the package substrate 1 is shortened, and the signal transmission speed is improved.

For example, the pins (i.e., input/output (I/O)) terminals) of the first chip 2 are redistributed through the package substrate 1 and the plurality of solder balls 20 located on the second surface B of the package substrate 1. At this point, the chip package structure 100 is a fan-out chip package structure, and the fan-out chip package structure is connected to the external module (such as a motherboard or a printed circuit board) through the solder balls 20.

Figure 9:
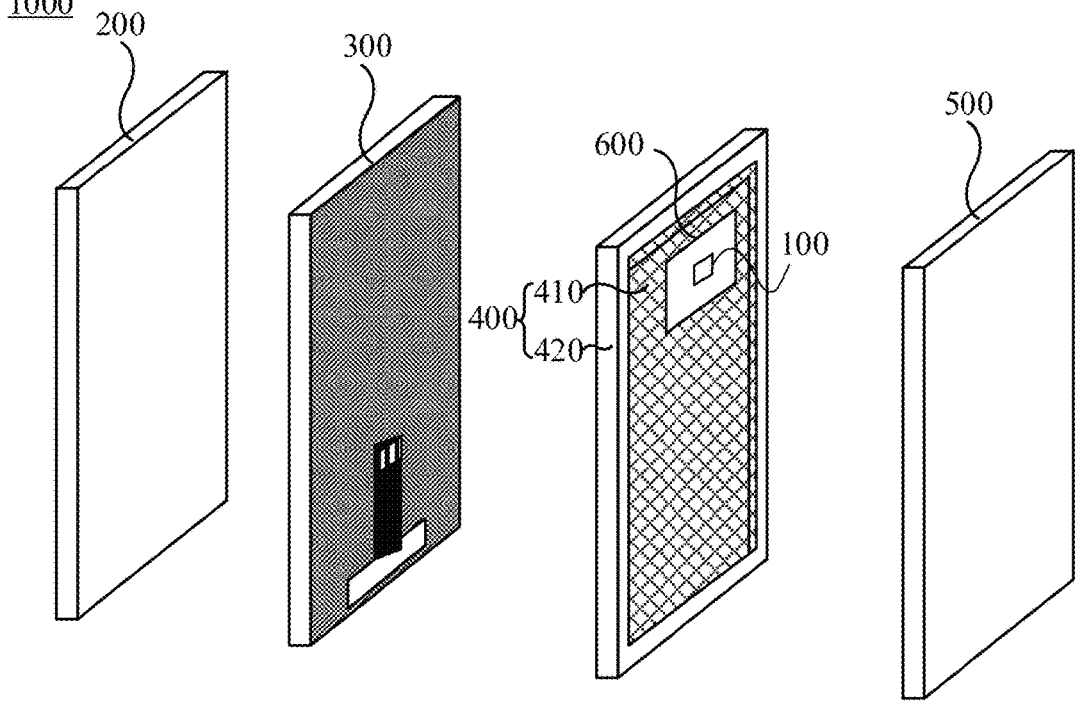
FIG. 9 is a schematic structure diagram of an electronic device according to some examples.

The example of the present disclosure also provides an electronic device 1000. As shown in FIG. 9, the electronic device 1000 includes the chip package structure 100 according to some above examples.

For example, as shown in FIG. 9, the electronic device may further include a cover plate 200, a display screen 300, a middle frame 400, and a back shell 500.

The display screen 300 may be a liquid crystal display (LCD) screen, and may also be an organic light emitting diode (OLED) display screen, a quantum dot light emitting diode (QLED) display screen, a mini light emitting diode (Mini LED) display screen or a micro light emitting diode (Micro LED) display screen, etc. The OLED display screen, QLED display screen, Mini LED display screen and Micro LED display screen are all self-luminous display screens.

The middle frame 400 may include a carrier plate 410 and a frame 420. The electronic device 1000 may further include a circuit board 600 disposed on the carrier plate 410. The chip package structure 100 is disposed on the circuit board 600 and electrically connected to the circuit board 600.

The beneficial effects that can be achieved by the electronic device according to the present disclosure can refer to the above beneficial effects of the semiconductor structure, which will not be repeated here.

The above electronic device may be any one of a mobile phone, a desktop computer, a tablet computer, a notebook computer, a server, a vehicle-mounted device, a wearable device (such as a smart watch, a smart bracelet and smart glasses), a mobile power supply, a game machine, a digital multimedia player, etc.

Figure 10:
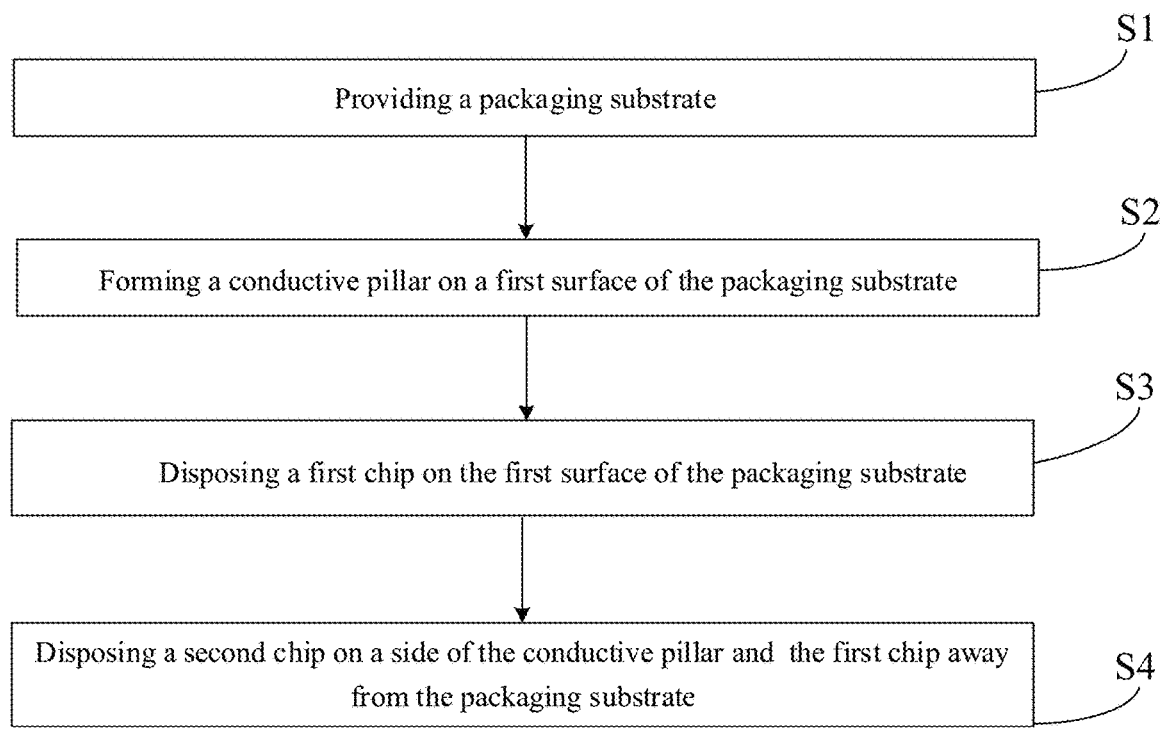
FIG. 10 is a flow chart of a manufacturing method of a chip package structure according to some examples.

The example of the present disclosure provides a manufacturing method of a chip package structure, and the manufacturing method is, for example, used for preparing the chip package structure 100 according to some above examples. FIG. 10 is a flowchart of a manufacturing method of a chip package structure according to some examples of the present disclosure. FIGS. 11A to 11E, 12A to 12C, 13A to 13C, and 14A to 14C are respectively structure cross-sectional diagrams corresponding to steps in the manufacturing method of a chip package structure according to some examples. It should be understood that the steps shown in FIG. 10 are not exclusive, and other steps may be executed before, after or between any shown steps. In addition, some of these steps may be executed simultaneously, or may be executed in an order different from that shown in FIG. 10.

As shown in FIG. 10, the above manufacturing method includes the following steps S1 to S4.

Figure 11A:
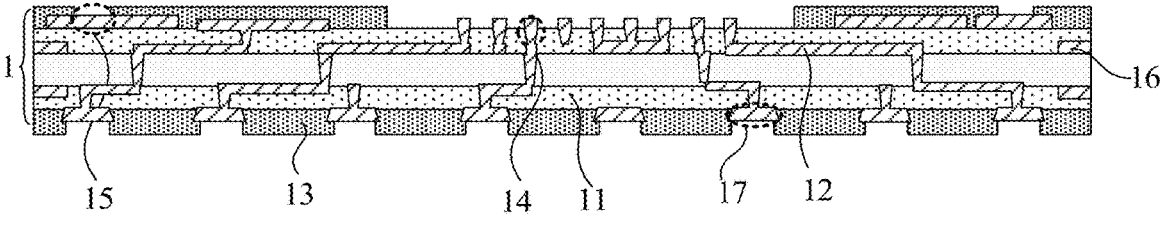
FIGS. 11A to 11E are structure diagrams corresponding to steps in a manufacturing method of a chip package structure according to some examples.

S1: as shown in FIG. 11A, the package substrate 1 is provided.

For example, the structure of the package substrate 1 may refer to the illustrations in some above examples, which will not be repeated here.

Figure 11B:
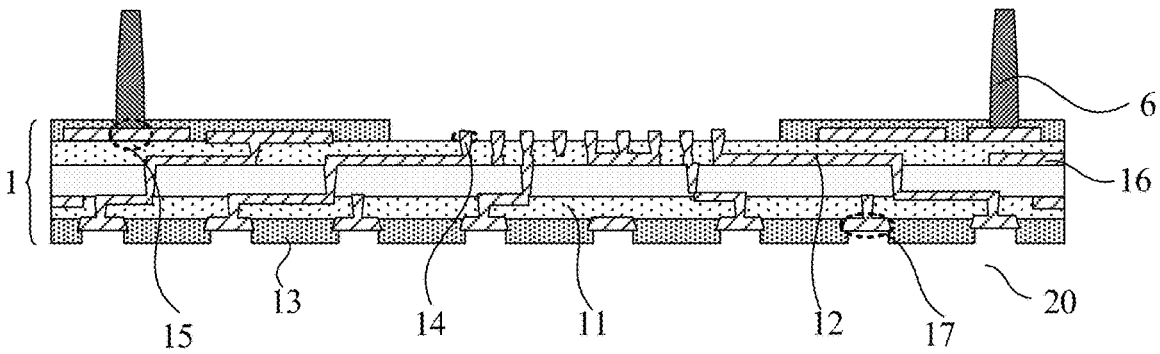
Figure 12A:
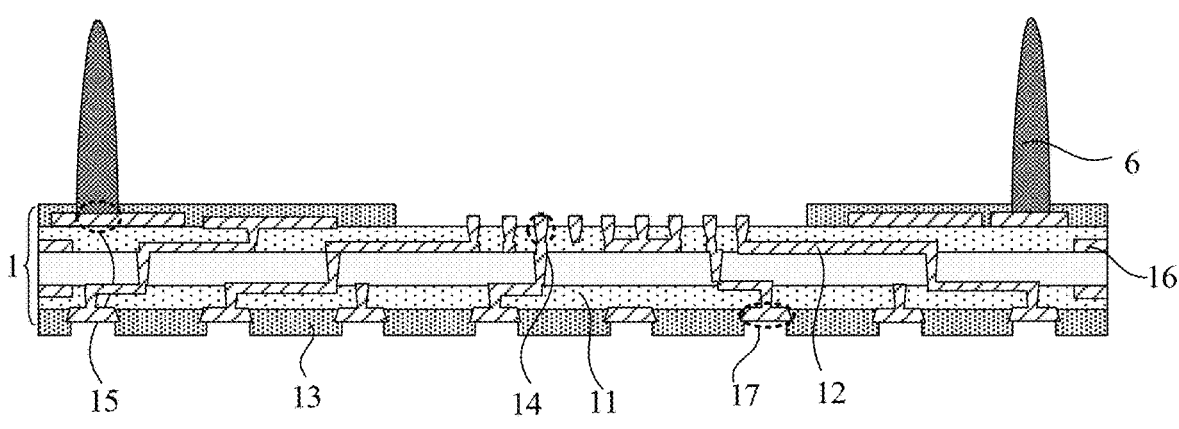
FIGS. 12A to 12C are structure diagrams corresponding to steps of a manufacturing method of a conductive pillar according to some examples.

S2: as shown in FIG. 11B and FIG. 12A, the conductive pillars 6 are formed on the first surface A of the package substrate 1, and the conductive pillars 6 are electrically connected to the package substrate 1.

For example, the conductive pillars 6 may be formed by a sputtering process or an electroplating process. The material of the conductive pillars 6 may include at least one of copper, aluminum, silver or tin.

Figure 11C:
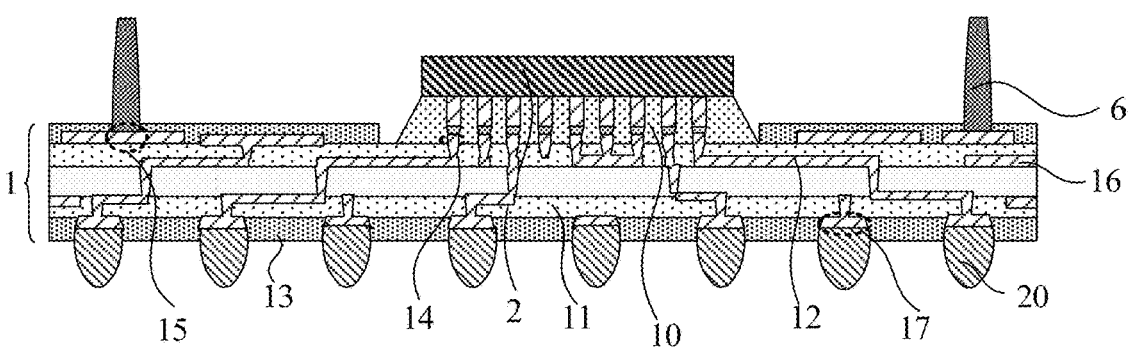

S3: as shown in FIG. 11C, the first chip 2 is disposed on the first surface A of the package substrate 1. The first chip 2 is electrically connected to the package substrate 1.

For example, a connection way of the first chip 2 and the package substrate 1 may refer to the illustrations in some above examples, which will not be repeated here.

Figure 11D:
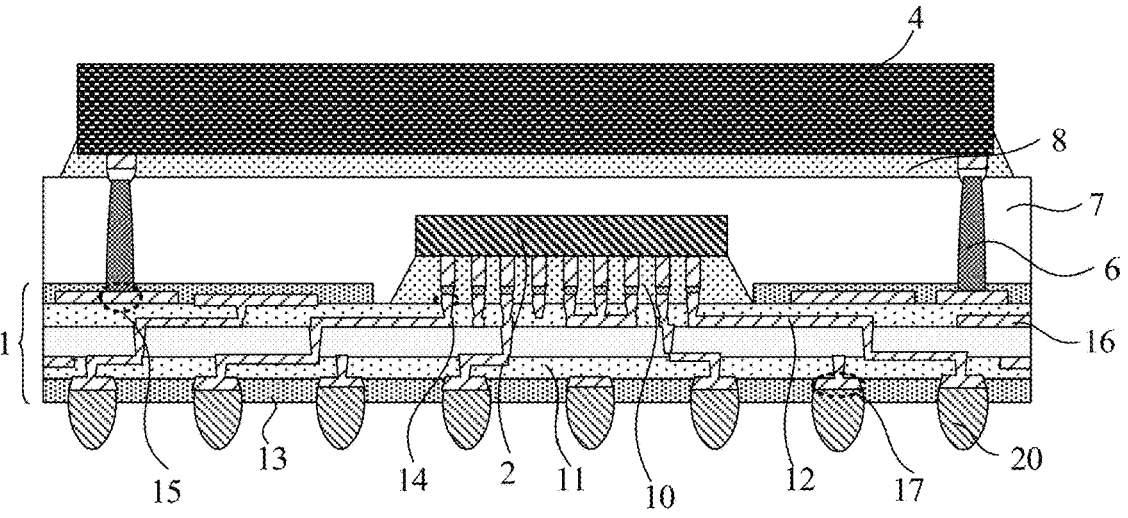

S4: as shown in FIG. 11D, the second chip 4 is disposed on a side of the conductive pillars 6 and the first chip 2 away from the package substrate 1. The second chip 4 is electrically connected to the conductive pillars 6.

For example, the orthographic projections of the conductive pillars 6 on the package substrate 1 are located within the orthographic projection of the first chip 2 or the second chip 4 on the package substrate 1.

The manufacturing method disclosed in the above example of the present disclosure has the same structure and beneficial effects as the chip package structure 100 according to some above examples, which will not be repeated here.

It should be noted that some steps of the above manufacturing method may be executed simultaneously, or may be executed in an order different from that shown in FIG. 10.

For example, the above steps S2 and S3 may be reversed, that is, the first chip 2 is firstly disposed on the first surface A of the package substrate 1, and then the conductive pillars 6 are formed on the first surface A of the package substrate 1.

In some examples, after the above step S2, the above manufacturing method further includes: S10 to S20.

Figure 12B:
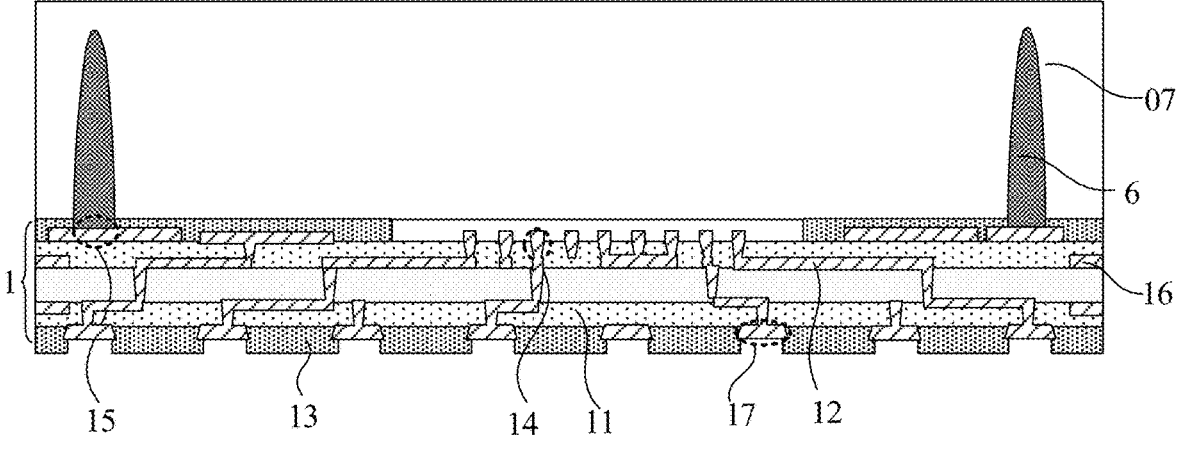

S10: as shown in FIG. 12B, a package film 07 is formed on the first chip 2 and the conductive pillars 6, and the package film 07 covers the first chip 2 and the conductive pillars 6.

The example of the present disclosure may use chemical vapor deposition (CVD) or physical vapor deposition (PVD) to form the package film 07. A thickness of the package film is greater than the height of the conductive pillar and the thickness of the first chip, that is, relative to the package substrate, the surface on the side of the package film away from the package substrate is higher than the surface on the side of the conductive pillar away from the package substrate and higher than the surface on the side of the first chip away from the package substrate.

Figure 12C:
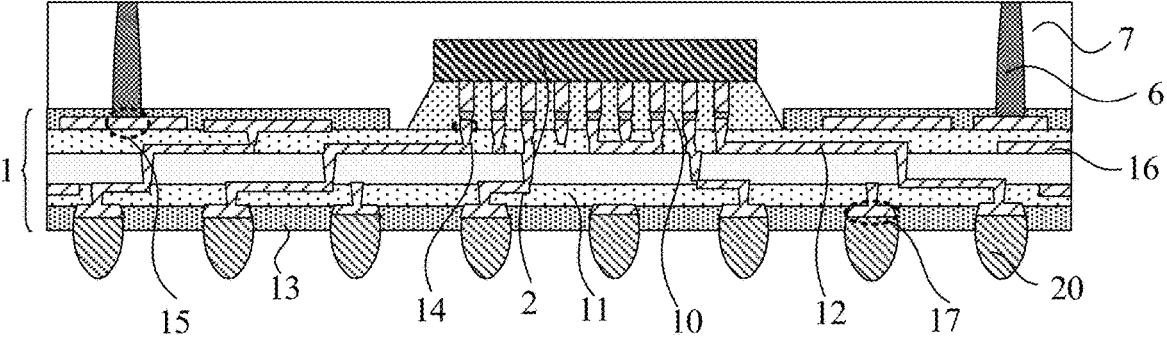

S20: as shown in FIG. 12C, the package film 07 is thinned to expose the conductive pillars 6, and the remaining package film 07 forms the package layer 7; the package layer 7 covers the first chip 2.

For example, the package film 07 may be thinned by mechanical polishing, chemical mechanical planarization, wet etching and other thinning processes. In the above step S20, in the process of thinning the package film, the height of the conductive pillars 6 may also be lowered to ensure that the conductive pillars 6 are exposed, thereby improving an electrical connection yield between the conductive pillars 6 and the second chip 4.

Specifically, the package film 07 covering the first chip 2 and the conductive pillars 6 may be formed by a molding material through a molding process.

In some examples, the above step S2 includes: S21 to S23.

Figure 13A:
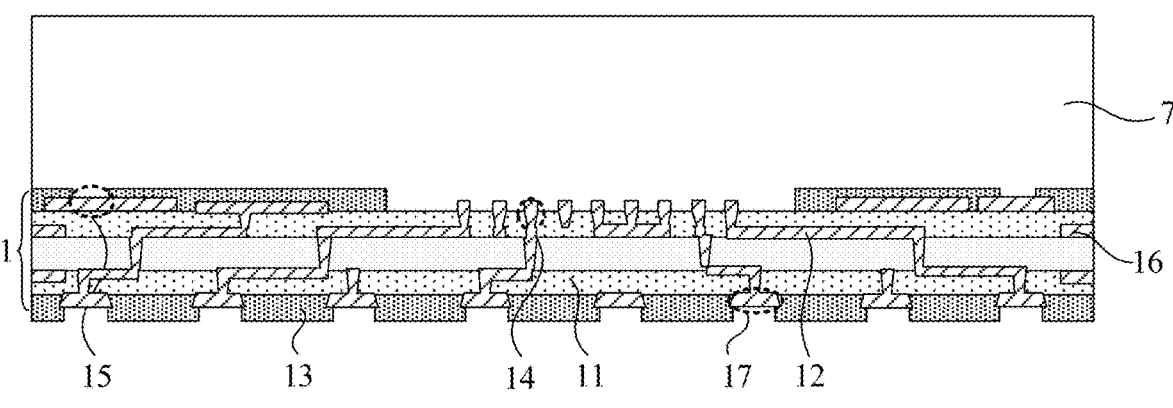
FIGS. 13A to 13C are structure diagrams corresponding to steps of another manufacturing method of a conductive pillar according to some examples.

S21: as shown in FIG. 13A, the package layer 7 is formed on the first chip 2, and the package layer 7 covers the first chip 2.

Specifically, the covering package layer 7 may be formed by the molding material through the molding process.

Figure 13B:
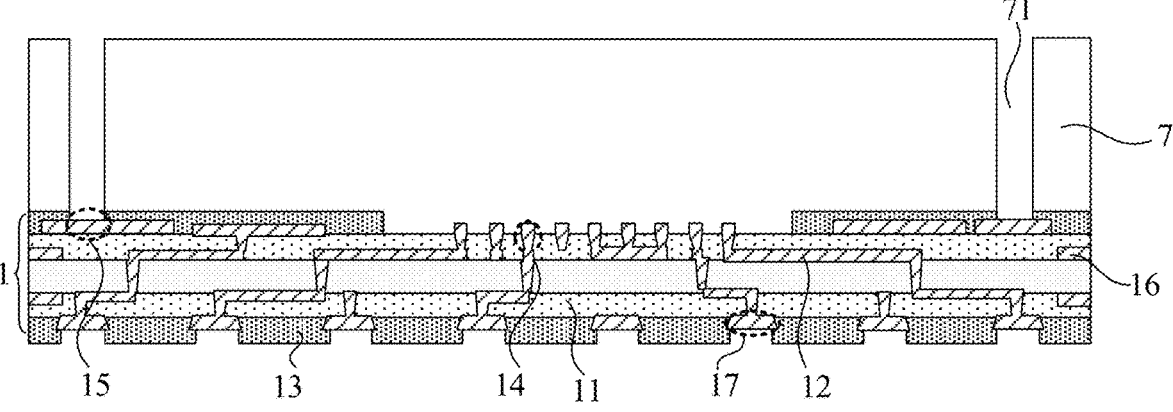

S22: as shown in FIG. 13B, vias 71 are formed in the package layer 7, and the vias 71 expose the second pads 15.

In the example of the present disclosure, the vias 71 may be formed through an etching process. The shape of the vias 71 may be columnar, for example, cylindrical and the like. The shape of the vias 71 may also be other irregular shapes, which is not limited by the example of the present disclosure.

Figure 13C:
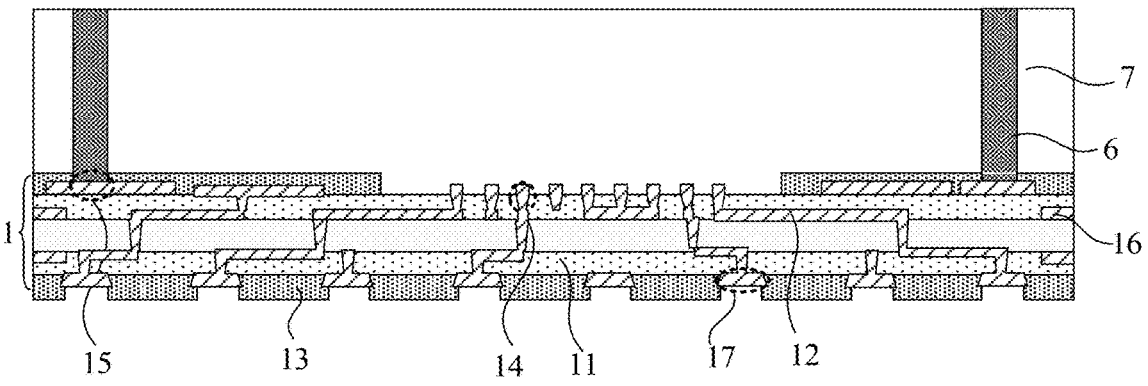

S23: as shown in FIG. 13C, a conductive material is filled in the vias to form the conductive pillars 6.

In one example, the material of the conductive pillars 6 may be tin or the like. At this point, solder balls may be filled in the vias and reflowed to form solder pillars, which are the above conductive pillars 6.

In some examples, as shown in FIG. 11D, the above manufacturing method further includes: filling a first insulating material between the package layer 7 and the second chip 4 to form the first filling portion 8, and the first filling portion 8 surrounds each pin of the second chip 4.

In one example, the first filling portion 8 is located between the package layer 7 and the second chip 4, and the second chip 4 covers the first filling portion 8. Alternatively, the first filling portion 8 is located not only between the package layer 7 and the second chip 4, but also on both sides of the second chip 4, and the orthographic projection of the second chip 4 on the package substrate 1 is located within the range of the orthographic projection of the first filling portion 8 on the package substrate 1.

The first filling portion 8 is filled between any two adjacent pins of the second chip 4, so as to avoid short circuit between the two adjacent pins.

In one example, the first insulating material may be an epoxy resin material or the like.

In the present examples, by disposing the first filling portion 8 between the package layer 7 and the second chip 4, not only can the support be provided for the second chip 4, but also the bonding force between the second chip 4 and the package layer 7 is enhanced, which ensures the structure stability of the second chip 4, and also avoids short circuit between any two adjacent pins of the second chip 4, thereby further ensuring the yield of the chip package structure 100.

Figure 11E:
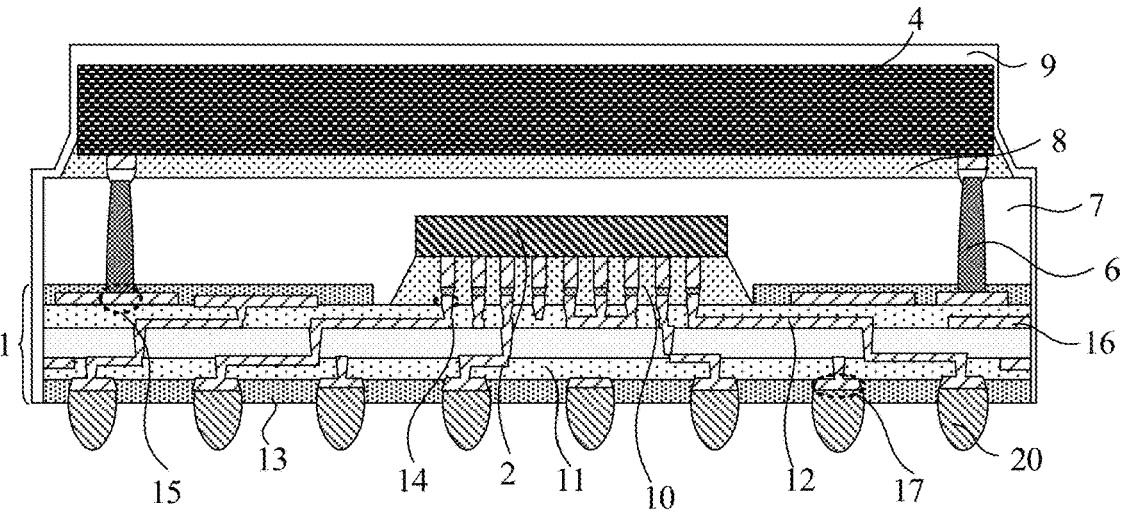

In some examples, the above manufacturing method further includes: forming the electromagnetic shielding layer 9, and the electromagnetic shielding layer 9 at least covers the second chip 4 as well as the sides of the package layer 7, as shown in FIG. 11E.

In one example, the electromagnetic shielding layer 9 is made of a ferromagnetic material (such as steel) with a very high magnetic permeability, and the electromagnetic shielding layer 9 may electromagnetically shield a covered region thereof.

In the examples of the present disclosure, the electromagnetic shielding layer 9 may be formed on the second chip 4 as well as the sides of the package layer 7 by means of spraying, electroplating, vacuum sputtering or the like. For example, the ferromagnetic material may be sprayed on the second chip 4 as well as the sides of the package layer 7 to form the electromagnetic shielding layer 9.

By disposing the electromagnetic shielding layer 9, the first chip 2 and the second chip 4 can be effectively prevented from being subjected to electromagnetic interference, thereby improving the anti-electromagnetic interference capability of the chip package structure 100.

In some examples, the second chip 4 includes a plurality of sub-chips 42. At this point, the above step S4 includes: S41 to S42.

Figure 14A:
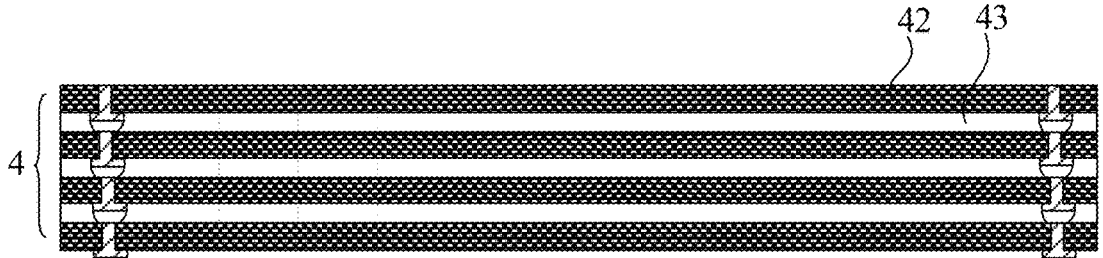
FIGS. 14A to 14C are structure diagrams corresponding to steps of a manufacturing method of a second chip according to some examples.

S41: as shown in FIG. 14A, the plurality of sub-chips 42 are sequentially stacked along a thickness direction of the sub-chips 42 to form the second chip 4.

For example, the plurality of sub-chips 42 are stacked in sequence along the direction perpendicular to the package substrate 1 and away from the package substrate 1. For example, the types of the plurality of sub-chips are the same, and optionally, the plurality of sub-chips are all memory chips.

In some examples, an isolation structure 43 is disposed between two adjacent sub-chips 42. The material of the isolation structure 43 may be an adhesive material. Two adjacent sub-chips 42 are stacked by the adhesive material.

In some examples, there may be a plurality of connection relationships of the plurality of sub-chips 42, and the details may refer to the illustrations in some above examples, and will not be repeated here.

Figure 14B:
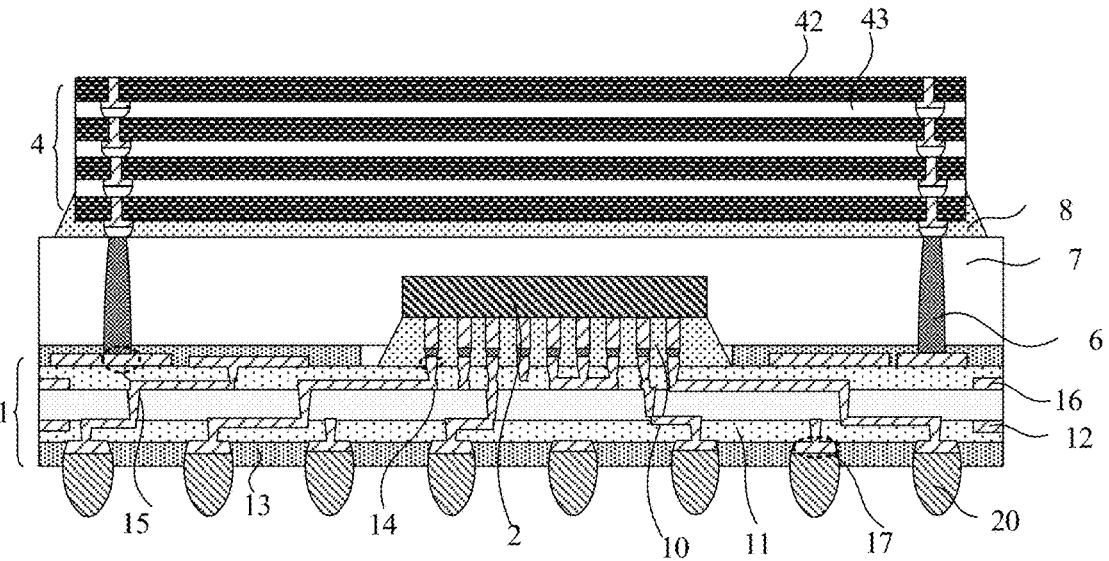

S42: as shown in FIG. 14B, the second chip 4 is soldered to ends of the conductive pillars 6 away from the package substrate 1, so that the second chip 4 is electrically connected to the conductive pillars 6.

Figure 14C:
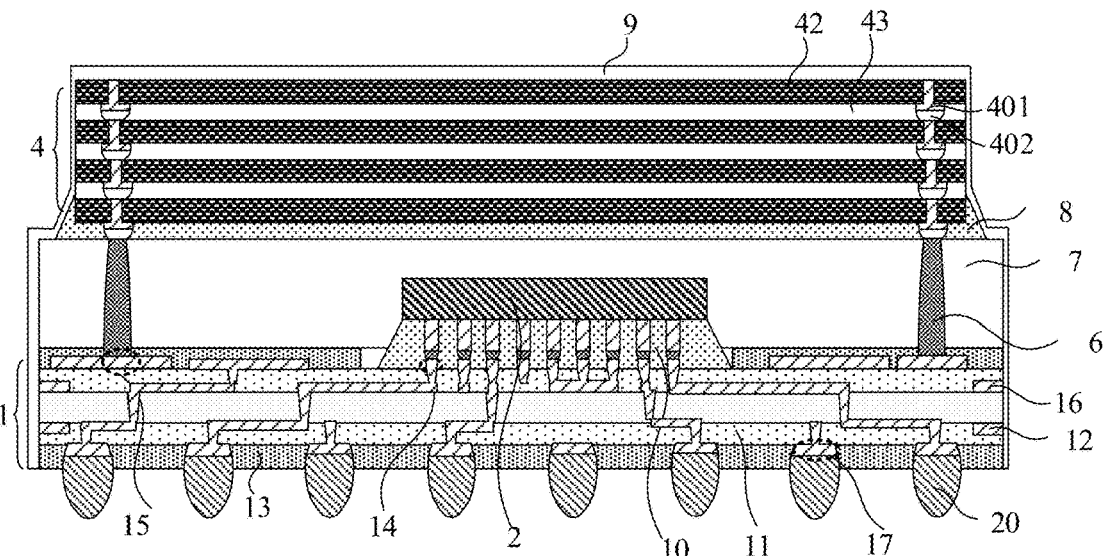

In some examples, as shown in FIG. 14C, after the above step S42, the electromagnetic shielding layer 9 may be formed, and the electromagnetic shielding layer 9 at least covers the plurality of sub-chips 42 and the sides of the package layer 7.

In the present examples, by stacking the plurality of sub-chips 42 to form the second chip 4, the integration degree of the chip package structure 100 can be improved and the product performances of the chip package structure 100 can be improved on the basis of ensuring a small package volume.

In some examples, after the first chip 2 is disposed and before the second chip 4 is disposed, the above manufacturing method further includes: filling a second insulating material between the package substrate 1 and the first chip 2 to form the second filling portion 10, and the second filling portion 10 surrounds each pin of the first chip 2, as shown in FIG. 11C.

The second filling portion 10 is filled between any two adjacent pins of the first chip 2, so as to avoid short circuit between the two adjacent pins.

In some examples, the second insulating material may be an epoxy resin material or the like. At this point, in the present example, by disposing the second filling portion 10 between the package substrate 1 and the first chip 2, not only can the support be provided for the first chip 2, but also the bonding force between the first chip 2 and the package substrate 1 is improved, and the structure stability of the first chip 2 is ensured. The short circuit between any two adjacent pins of the first chip 2 can also be avoided, which ensures the yield of the chip package structure 100.

In some examples, third pads 17 are disposed on the second surface B of the package substrate 1. The first surface A and the second surface B are opposite to each other. Before or after forming the package layer 7, the above manufacturing method further includes: forming the solder balls 20 on the second surface B of the package substrate 1, and the solder balls 20 are electrically connected to the third pads 17, as shown in FIG. 11D.

In some examples, the solder balls 20 may be soldered on the third pads 17 by a ball planting process.

In some examples, a number of solder balls 20 is greater than one, the plurality of solder balls 20 may form a ball grid array (BGA), and the ball grid array may serve as an interface between the chip package structure 100 and the outside world.

Examples of the present disclosure provide a chip package structure, a manufacturing method thereof, and an electronic device, for the purposes of reducing the area of the chip package structure and improving the rate of signal transmission.

To fulfill the above objects, the examples of the present disclosure have the following technical solutions.

In an aspect, a chip package structure is provided. The chip package structure includes a package substrate, a first chip, a conductive pillar and a second chip, wherein the package substrate has a first surface; the first chip is located on the first surface of the package substrate and electrically connected to the package substrate; the conductive pillar is located on the first surface of the package substrate and electrically connected to the package substrate, the second chip is located on a side of the first chip and the conductive pillar away from the package substrate and electrically connected to the conductive pillar; and an orthographic projection of the conductive pillar on the package substrate is located within a range of an orthographic projection of the first chip or the second chip on the package substrate.

In the chip package structure according to the foregoing example of the present disclosure, the second chip is placed above the first chip, such that the package substrate, the first chip, the conductive pillar and the second chip form a stacked structure, which improves the compactness of the chip package structure and helps to reduce the area of the chip package structure. Moreover, the conductive pillar is provided to realize the electrical connection between the second chip and the package substrate, and the conductive pillar is disposed under the first chip 2 or the second chip such that the orthographic projection of the conductive pillar on the package substrate is located within the range of the orthographic projection of the first chip 2 or the second chip on the package substrate. In this way, the space around the first chip 2 or the second chip may not be occupied, which helps to further miniaturize the chip package structure and to further reduce the area of the chip package structure.

In some examples, an orthographic projection of the conductive pillar on the package substrate is also located within a range of an orthographic projection of the first chip on the package substrate.

In some examples, the chip package structure further includes a package layer, and the package layer is located between the package substrate and the second chip, covers the first chip and surrounds sides of the conductive pillar.

In some examples, an orthographic projection of the second chip on the package substrate is located within a range of an orthographic projection of the package layer on the package substrate.

In some examples, the chip package structure further includes a first filling portion, and at least part of the first filling portion is located between the package layer and the second chip and the first filling portion surrounds each pin of the second chip.

In some examples, the chip package structure further includes an electromagnetic shielding layer, and the electromagnetic shielding layer at least covers the second chip as well as sides of the package layer.

In some examples, the package substrate further includes at least one ground wire, and the electromagnetic shielding layer also covers sides of the package substrate and is electrically connected to the ground wire.

In some examples, the second chip comprises a plurality of sub-chips sequentially stacked in a direction perpendicular to and away from the package substrate.

In some examples, two adjacent sub-chips are electrically connected to each other.

In some examples, one of the plurality of sub-chips close to the package substrate is electrically connected to the conductive pillar, and others of the plurality of sub-chips are electrically connected to the package substrate by a wire.

In some examples, a surface on a side of the second chip close to the package substrate is higher than a surface on a side of the first chip away from the package substrate, with respect to the first surface of the package substrate.

In some examples, a distance between the surface on the side of the second chip close to the package substrate and the first surface of the package substrate is h1, a distance between the surface on the side of the first chip away from the package substrate and the first surface of the package substrate is h2, and h1 and h2 meet the following condition:

$$\frac{5}{8} \le \frac{h2}{h1} \le \frac{4}{5}.$$

In some examples, a number of the conductive pillars is greater than one, and the plurality of conductive pillars are at least located on two opposite sides of the first chip.

In some examples, the chip package structure further includes a second filling portion, and at least part of the second filling portion is located between the package substrate and the first chip and the second filling portion surrounds each pin of the first chip.

In some examples, the package substrate has a second surface opposite to the first surface, and the chip package structure further comprises a solder ball located on the second surface of the package surface and electrically connected to the package substrate.

In another aspect, another chip package structure is provided. The chip package structure includes: a package substrate having a first surface; a first chip disposed on the first surface of the package substrate and electrically connected to the package substrate; and a second chipset located on a side of the first chip away from the package substrate, electrically connected to the package substrate, and comprising a plurality of second chips sequentially stacked in a direction perpendicular to and away from the package substrate.

In some examples, two adjacent second chips are electrically connected to each other.

In some examples, each of the plurality of second chips is electrically connected to the package substrate by a wire.

In some examples, the chip package structure further includes a package layer, and the package layer is located between the package substrate and the second chipset and covers the first chip.

In some examples, an orthographic projection of the second chipset on the package substrate is located within a range of an orthographic projection of the package layer on the package substrate.

In some examples, the chip package structure further includes a first filling portion, and at least part of the first filling portion is located between the package layer and the second chipset and the first filling portion surrounds each pin of one second chip close to the package substrate.

In some examples, the chip package structure further includes an electromagnetic shielding layer, the electromagnetic shielding layer at least covers the second chipset as well as sides of the package layer.

In some examples, the package substrate includes at least one ground wire, and the electromagnetic shielding layer also covers sides of the package substrate and is electrically connected to the ground wire.

In some examples, a surface on a side of the second chipset close to the package substrate is higher than a surface on a side of the first chip away from the package substrate, with respect to the first surface of the package substrate.

In some examples, a distance between the surface on the side of the second chipset close to the package substrate and the first surface of the package substrate is h1, a distance between the surface on the side of the first chip away from the package substrate and the first surface of the package substrate is h2, and h1 and h2 meet the following condition:

$$\frac{5}{8} \le \frac{h2}{h1} \le \frac{4}{5}.$$

In some examples, the chip package structure further includes a second filling portion, and at least part of the second filling portion is located between the package substrate and the first chip and the second filling portion surrounds each pin of the first chip.

In some examples, the package substrate has a second surface opposite to the first surface, and the chip package structure further comprises a solder ball located on the second surface of the package surface and electrically connected to the package substrate.

In yet another aspect, an electronic device is provided. The electronic device includes the chip package structure as described in some examples above.

In still another aspect, a manufacturing method of a chip package structure is provided. The manufacturing method includes: providing a package substrate having a first surface on which a first pad and a second pad are disposed at an interval; forming a conductive pillar on the first surface of the package structure, the conductive pillar being electrically connected to the second pad; disposing a first chip on the first surface of the package substrate, the first chip being electrically connected to the first pad; and disposing a second chip on a side of the conductive pillar and the first chip away from the package substrate, the second chip being electrically connected to the conductive pillar, an orthographic projection of the conductive pillar on the package substrate being located within a range of an orthographic projection of the second chip on the package substrate.

In some examples, before the disposing the second chip on the side of the conductive pillar and the first chip away from the package substrate, the manufacturing method further comprises: forming a package film on the first chip and the conductive pillar, the package film covering the first chip and the conductive pillar; and thinning the package film to expose the conductive pillar and to obtain a package layer, the package layer covering the first chip.

In some examples, the forming the conductive pillar on the first surface of the package substrate comprises: forming a package layer on the first chip, the package layer covering the first chip; forming a via in the package layer, the via exposing a second pad; and filling the via with a conductive material to form the conductive pillar.

In some examples, the manufacturing method further includes: filling a first insulating material between the package layer and the second chip to form a first filling portion, the first filling portion surrounding each pin of the second chip.

In some examples, the manufacturing method further includes: forming an electromagnetic shielding layer, the electromagnetic shielding layer at least covering the second chip as well as sides of the package layer.

In some examples, the second chip comprises a plurality of sub-chips; and the disposing the second chip on the side of the conductive pillar and the first chip away from the package substrate comprises: sequentially stacking the plurality of sub-chips in a thickness direction of the sub-chips to form the second chip; and soldering the second chip with an end of the conductive pillar away from the package substrate, such that the second chip is electrically connected to the conductive pillar.

In some examples, after disposing the first chip and before disposing the second chip, the manufacturing method further includes: filling a second insulating material between the package substrate and the first chip to form a second filling portion, the second filling portion surrounding each pin of the first chip.

In some examples, a third pad is disposed on a second surface of the package substrate, and the first surface and the second surface are opposite to each other; and before or after forming the package layer, the manufacturing method further includes: forming a solder ball on the second surface of the package substrate, the solder ball being electrically connected to the third pad.

It can be understood that for the beneficial effects of the electronic device and the manufacturing method of the chip package structure provided by the foregoing examples of the present disclosure, a reference may be made to the beneficial effects of the chip package structure described above, which will not be repeated herein.

The foregoing is only specific implementations of the present disclosure, but the scope of protection of the present disclosure is not limited thereto. Changes or substitutions easily conceivable for any skilled familiar with the technical field within the technical scope disclosed in the present disclosure should be covered within the scope of protection of the present disclosure. Therefore, the scope of protection of the present disclosure should be based on the scope of protection of the claims.

What is claimed is:

1. A chip package structure comprising:
a package substrate having a first surface;
a first chip located on the first surface of the package substrate and electrically connected to the package substrate;
a conductive pillar located on the first surface of the package substrate and electrically connected to the package substrate;
a second chip located on a side of the first chip and the conductive pillar away from the package substrate and electrically connected to the conductive pillar, an orthographic projection of the conductive pillar on the package substrate being located within a range of an orthographic projection of the first chip or the second chip on the package substrate; and
a shielding layer located on a side of the second chip away from the first chip.

2. The chip package structure according to claim 1, wherein the chip package structure further includes a package layer, wherein the package layer is located between the package substrate and the second chip and covers the first chip and surrounds sides of the conductive pillar.

3. The chip package structure according to claim 2, wherein the orthographic projection of the second chip on the package substrate is located within a range of an orthographic projection of the package layer on the package substrate.

4. The chip package structure according to claim 2, wherein the chip package structure further includes a first filling portion, wherein at least part of the first filling portion is located between the package layer and the second chip and the first filling portion surrounds each pin of the second chip.

5. The chip package structure according to claim 2, wherein the shielding layer at least covers the side of the second chip and sides of the package layer.

6. The chip package structure according to claim 5, wherein the package substrate includes at least one ground wire, and the shielding layer also covers sides of the package substrate and is electrically connected to the ground wire.

7. The chip package structure according to claim 1, wherein the second chip includes a plurality of sub-chips sequentially stacked in a direction perpendicular to and away from the package substrate.

8. The chip package structure according to claim 7, wherein two adjacent sub-chips are electrically connected to each other.

9. The chip package structure according to claim 7, wherein one of the plurality of sub-chips close to the package substrate is electrically connected to the conductive pillar, and others of the plurality of sub-chips are electrically connected to the package substrate by a wire.

10. The chip package structure according to claim 1, wherein a surface on a side of the second chip close to the package substrate is higher than a surface on a side of the first chip away from the package substrate with respect to the first surface of the package substrate.

11. The chip package structure according to claim 10, wherein a distance between the surface on the side of the second chip close to the package substrate and the first surface of the package substrate is h1, a distance between the surface on the side of the first chip away from the package substrate and the first surface of the package substrate is h2, and h1 and h2 meet the following condition:

$$\frac{5}{8} \le \frac{h2}{h1} \le \frac{4}{5}.$$

12. The chip package structure according to claim 1, wherein a number of conductive pillars is greater than one, and a plurality of the conductive pillars are at least located on two opposite sides of the first chip.

13. The chip package structure according to claim 4, wherein the chip package structure further includes a second filling portion, wherein at least part of the second filling portion is located between the package substrate and the first chip and the second filling portion surrounds each pin of the first chip.

14. The chip package structure according to claim 1, wherein the package substrate has a second surface opposite to the first surface, and the chip package structure further includes a solder ball located on the second surface of a package surface and electrically connected to the package substrate.

15. A manufacturing method of a chip package structure, the method comprising:
providing a package substrate having a first surface;
forming a conductive pillar on the first surface of the package substrate, the conductive pillar being electrically connected to the package substrate;
disposing a first chip on the first surface of the package substrate, the first chip being electrically connected to the package substrate;
disposing a second chip on a side of the conductive pillar and the first chip away from the package substrate, the second chip being electrically connected to the conductive pillar, an orthographic projection of the conductive pillar on the package substrate being located within a range of an orthographic projection of the first chip or the second chip on the package substrate; and
disposing a shielding layer on a side of the second chip away from the first chip.

* * * * *